(12) United States Patent
Kando et al.

(10) Patent No.: US 9,190,981 B2
(45) Date of Patent: Nov. 17, 2015

(54) ELASTIC WAVE DEVICE INCLUDING A SUPPORTING SUBSTRATE, MEDIUM LAYER, AND PIEZOELECTRIC BODY

(71) Applicant: Murata Manufacturing Co., Ltd., Nagaokakyo-shi, Kyoto-fu (JP)

(72) Inventors: Hajime Kando, Nagaokakyo (JP); Hideki Iwamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 83 days.

(21) Appl. No.: 14/226,854

(22) Filed: Mar. 27, 2014

(65) Prior Publication Data

US 2014/0203893 A1 Jul. 24, 2014

Related U.S. Application Data

(63) Continuation of application No. PCT/JP2012/074385, filed on Sep. 24, 2012.

(30) Foreign Application Priority Data

Sep. 30, 2011 (JP) ................................. 2011-216939

(51) Int. Cl.
*H03H 9/17* (2006.01)
*H03H 9/02* (2006.01)

(52) U.S. Cl.
CPC ............. *H03H 9/17* (2013.01); *H03H 9/02574* (2013.01); *H03H 9/0222* (2013.01); *H03H 9/02559* (2013.01)

(58) Field of Classification Search
CPC ... H03H 9/17; H03H 9/0222; H03H 9/02559; H03H 9/02574

USPC ........ 333/193–196; 310/313 R, 313 B, 313 D
See application file for complete search history.

(56) References Cited

U.S. PATENT DOCUMENTS

2009/0236935 A1* 9/2009 Kando ................ H03H 9/0222
  310/313 R
2009/0267449 A1 10/2009 Goto et al.
(Continued)

FOREIGN PATENT DOCUMENTS

CN   101939911 A   1/2011
EP   2 658 123 A1  10/2013
(Continued)

OTHER PUBLICATIONS

Official Communication issued in International Patent Application No. PCT/JP2012/074385, mailed on Dec. 11, 2012.
(Continued)

*Primary Examiner* — Barbara Summons
(74) *Attorney, Agent, or Firm* — Keating & Bennett, LLP

(57) ABSTRACT

An elastic wave device includes a medium layer, a piezoelectric body, and an IDT electrode that are disposed on a supporting substrate. The medium layer is made of a medium containing a low-velocity medium in which a propagation velocity of a same bulk wave as that which is a main vibration component of an elastic wave propagating in the piezoelectric body and being used is lower than a propagation velocity of the elastic wave, and a high-velocity medium in which the propagation velocity of the same bulk wave as that which is a main vibration component of the elastic wave is higher than the propagation velocity of the elastic wave.

13 Claims, 25 Drawing Sheets

(56) References Cited

U.S. PATENT DOCUMENTS

| | | | |
|---|---|---|---|
| 2010/0277036 A1 | 11/2010 | Shimizu et al. | |
| 2013/0285768 A1* | 10/2013 | Watanabe | H03H 9/0222 333/193 |
| 2014/0225684 A1* | 8/2014 | Kando | H03H 9/02559 333/195 |

FOREIGN PATENT DOCUMENTS

| | | |
|---|---|---|
| JP | 2001-196896 A | 7/2001 |
| JP | 2004-282232 A | 10/2004 |
| JP | 2007-228225 A | 9/2007 |
| WO | 2010/131606 A1 | 11/2010 |
| WO | 2011/074464 A1 | 6/2011 |
| WO | WO 2012/086639 * | 6/2012 |
| WO | 20131031651 A1 | 3/2013 |

OTHER PUBLICATIONS

Official Communication issued in corresponding Korean Patent Application No. 10-2014-7007932, mailed on Jul. 31, 2015.
Official Communication issued in corresponding European Patent Application No. 12835346.3, mailed on Sep. 7, 2015.

* cited by examiner

ELASTIC WAVE DEVICE INCLUDING A SUPPORTING SUBSTRATE, MEDIUM LAYER, AND PIEZOELECTRIC BODY

BACKGROUND OF THE INVENTION

1. Field of the Invention

The present invention relates to an elastic wave device which utilizes an elastic wave propagating in a piezoelectric body. More particularly, the present invention relates to an elastic wave device including a medium layer disposed between a supporting substrate and a piezoelectric body, in which vibration of the main propagation mode of an elastic wave propagating in the piezoelectric body is distributed to the medium layer.

2. Description of the Related Art

Elastic wave devices have been widely used as resonators and band filters. In recent years, there has been a strong demand for increasing the frequency of elastic wave devices.

Japanese Unexamined Patent Application Publication No. 2004-282232 discloses a surface acoustic wave device which meets the demand as described above. In Japanese Unexamined Patent Application Publication No. 2004-282232, a hard dielectric layer is disposed on a dielectric substrate. A piezoelectric thin film is stacked on the hard dielectric layer. Furthermore, an electrode for exciting a leaky surface acoustic wave is provided on the piezoelectric thin film. In this surface acoustic wave device, the normalized film thickness khp ($=2\pi Tp/\lambda$) is in a range of about 0.5 to 1.5, where $\lambda$ is the wavelength of the leaky surface acoustic wave, and Tp is the thickness of the piezoelectric thin film. It is described that, thereby, the frequency of the surface acoustic wave device can be increased.

In the surface acoustic wave device described in Japanese Unexamined Patent Application Publication No. 2004-282232, an increase in acoustic velocity is achieved by disposing the hard dielectric layer between the dielectric substrate and the piezoelectric thin film. However, in such a structure, not only the leaky surface acoustic wave intended to be used, but also a higher-order mode of the surface acoustic wave propagates while being reflected between the surface of the piezoelectric thin film and the interface between the piezoelectric thin film and the hard dielectric layer. Accordingly, spurious responses due to the higher-order mode occur, thus degrading characteristics, which is a problem.

Furthermore, in the known surface acoustic wave device, when the thickness of the piezoelectric thin film varies due to production variations, characteristics of the surface acoustic wave device vary, which is a problem.

SUMMARY OF THE INVENTION

Preferred embodiments of the present invention provide an elastic wave device in which a frequency is increased and a variation in frequency is small, spurious responses due to the higher-order mode are suppressed, and good resonance characteristics and filter characteristics are obtained.

An elastic wave device according to a preferred embodiment of the present invention includes a supporting substrate, a medium layer stacked on the supporting substrate, a piezoelectric body which is stacked on the medium layer and in which a bulk wave propagates, and an IDT electrode disposed on a surface of the piezoelectric body. The medium layer preferably includes a low-velocity medium in which the propagation velocity of the same bulk wave as that which is a main component of an elastic wave propagating in the piezoelectric body is lower than the acoustic velocity of the elastic wave propagating in the piezoelectric body, and a high-velocity medium in which the propagation velocity of the same bulk wave as that which is a main component of the elastic wave propagating in the piezoelectric body is higher than the acoustic velocity of the elastic wave propagating in the piezoelectric body. The medium layer is configured such that the acoustic velocity of the main vibration mode in the elastic wave device including the medium layer satisfies the relationship $V_L$<acoustic velocity of main vibration mode<$V_H$, where $V_H$ is the acoustic velocity of the main vibration mode in the case where the medium layer is made of the high-velocity medium, and $V_L$ is the acoustic velocity of the main vibration mode in the case where the medium layer is made of the low-velocity medium.

In a specific aspect of the elastic wave device according to a preferred embodiment of the present invention, the medium layer preferably is made of a composite medium prepared by mixing the low-velocity medium and the high-velocity medium. In this case, it is possible to easily form an intermediate-velocity medium having a bulk wave acoustic velocity between the acoustic velocity of the bulk wave propagating in the high-velocity medium and the acoustic velocity of the bulk wave propagating in the low-velocity medium according to the mixing ratio of the high-velocity medium and the low-velocity medium. Moreover, by adjusting the mixing ratio, the bulk wave propagating in the medium layer is controlled with high accuracy.

In another specific aspect of the elastic wave device according to a preferred embodiment of the present invention, the medium layer preferably is defined by a multilayer body including a low-velocity medium layer made of the low-velocity medium and a high-velocity medium layer made of the high-velocity medium. In such a case, it is possible to easily control the acoustic velocity of a bulk wave propagating in the medium layer by controlling the thickness of the low-velocity medium layer and the thickness of the high-velocity medium layer. Furthermore, the medium layer is easily formed only by stacking the low-velocity medium layer and the high-velocity medium layer. Preferably, the multilayer body includes three or more layers stacked on each other, for example.

In another specific aspect of the elastic wave device according to a preferred embodiment of the present invention, the acoustic velocity of a bulk wave component that propagates in the medium layer and that is the same bulk wave which is a main propagation mode of an elastic wave propagating in the piezoelectric body is a value between the acoustic velocity of the bulk wave propagating in the high-velocity medium and the acoustic velocity of a bulk wave propagating in the low-velocity medium. In this case, spurious responses due to the higher-order mode are suppressed more effectively and production variations are significantly reduced or prevented.

In an elastic wave device according to a preferred embodiment the present invention, preferably, the dielectric constant of the medium layer is lower than the dielectric constant of the piezoelectric body. In this case, the electromechanical coupling coefficient $k^2$ is significantly increased.

In another specific aspect of the elastic wave device according to a preferred embodiment of the present invention, in the medium layer defined by the multilayer body, the low-velocity medium layer preferably is disposed closer to the piezoelectric body than the high-velocity medium layer. In this case, convergence of the energy of elastic waves is greatly enhanced. Consequently, resonance characteristics are significantly improved.

In an elastic wave device according to a preferred embodiment of the present invention, since the medium layer includes the low-velocity medium and the high-velocity medium, it is possible to suppress or prevent variations in the frequency of the main propagation mode due to the thickness of the piezoelectric body. Furthermore, spurious responses due to the higher-order mode are effectively suppressed. Therefore, good resonance characteristics and filter characteristics are obtained while achieving an increase in frequency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
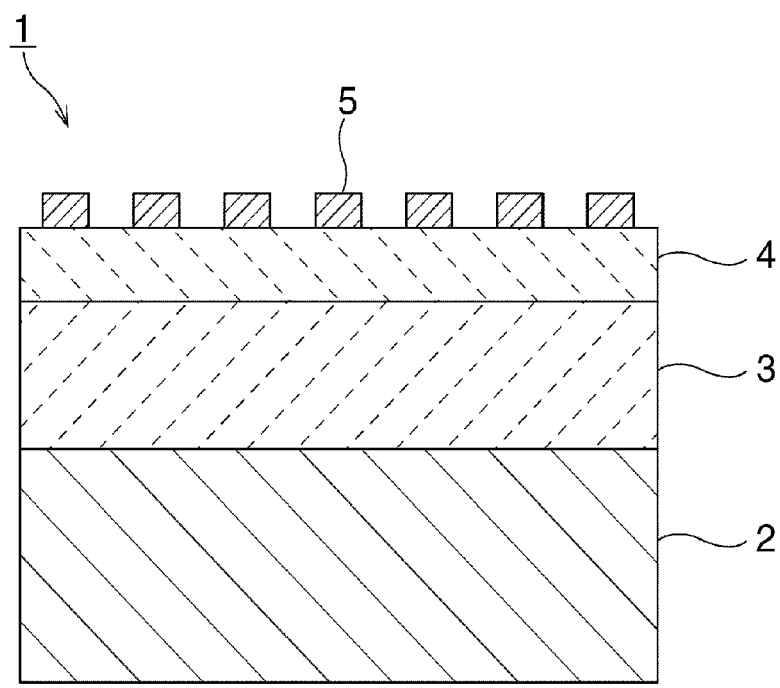
FIG. 1A is a schematic elevational cross-sectional view of an elastic wave device according to a preferred embodiment of the present invention.

The present invention will be clarified by describing specific preferred embodiments of the present invention with reference to the drawings.

In various preferred embodiments of the present invention, elastic waves and components of waves are defined as described below.

As is well known, elastic waves are waves that propagate along a surface of an elastic body or an interface between a solid and another solid. Elastic waves include surface acoustic waves, boundary acoustic waves, plate waves, and the like. Elastic waves are waves in which at least one vibration component among U1, U2, and U3 components propagates while being in a coupled state through the surface of an elastic body or the interface. Here, U1 represents the elastic wave propagation direction, U2 represents a planar direction parallel to the surface of an elastic body or the interface and a direction perpendicular to the elastic wave propagation direction, and U3 represents a direction perpendicular to the surface of an elastic body or the interface. The U1 component is a vibration component in the U1 direction and is also referred to as a P-wave component. Furthermore, the U2 component is a vibration component in the U2 direction and is also referred to as an SH-wave component. The U3 component is a vibration component in the U3 direction and is also referred to as an SV-wave component.

In elastic waves propagating in $LiTaO_3$ or $LiNbO_3$, which is an anisotropic crystal, the U1 to U3 components propagate while being in a coupled state in many crystal orientations. Among them, the propagation mode in which the vibration is mainly composed of the SV-wave component and the P-wave component is referred to as a Rayleigh wave in the case of surface acoustic waves, as a Stoneley wave in the case of boundary acoustic waves, and as a Lamb wave in the case of plate waves. The elastic wave propagation mode in which the vibration is mainly composed of the SH-wave component is referred to as an SH-type surface acoustic wave, an SH-type boundary acoustic wave, or an SH-type plate wave. As elastic waves in which the vibration is mainly composed of the P-wave component, longitudinal wave-type surface acoustic waves are known.

For example, the SH-type surface acoustic wave has an SH wave as the main vibration component and propagates with the SH wave being coupled to the SV wave and the P wave. Consequently, when the SH-type surface acoustic wave is taken for example, the SH wave is the main vibration component.

Regarding bulk waves which propagate in an isotropic elastic body, such as silicon oxide, silicon nitride, or aluminum nitride, there are transversal waves (S waves) in which displacement occurs in a direction perpendicular to the propagation direction and longitudinal waves (P waves) in which displacement occurs in a direction horizontal to the propagation direction. Furthermore, in bulk waves which propagate in an anisotropic elastic body, such as a single crystal or oriented film composed of aluminum nitride or the like, transversal waves propagate as two types of waves: fast transversal waves and slow transversal waves. These bulk waves have a specific acoustic velocity depending on the material.

In various preferred embodiments of the present invention, the term "high-velocity medium" refers to an elastic body in which the acoustic velocity of the same bulk wave as that which is a main vibration component of the elastic wave used in the elastic wave device is higher than the acoustic velocity of the elastic wave used. In the case where the main vibration component is an SH wave or SV wave, the term "same bulk wave" refers to a transversal wave having a displacement component in the substantially same direction. The term "low-velocity medium" refers to an elastic body in which the acoustic velocity of the same bulk wave as that which is a main vibration component of the elastic wave used in the elastic wave device is lower than the acoustic velocity of the elastic wave used. Furthermore, the intermediate acoustic velocity is defined as the acoustic velocity of a main vibration mode in the elastic wave device provided with the medium layer, the acoustic velocity of the main vibration mode satisfying the relationship $V_L$<acoustic velocity of main vibration mode<$V_H$, where $V_H$ is the acoustic velocity of the main vibration mode when the medium layer is made of the high-velocity medium, and $V_L$ is the acoustic velocity of the main vibration mode when the medium layer is made of the low-velocity medium. Hereinafter, unless otherwise indicated, the wavelength refers to the wavelength of the elastic wave used, namely, the main propagation mode. This wavelength is equal to the electrode finger period of the IDT electrode.

FIG. 1A is a schematic elevational cross-sectional view according to a first preferred embodiment of the present invention.

An elastic wave device 1 includes a supporting substrate 2. A medium layer 3 is stacked on the supporting substrate 2. A piezoelectric body 4 is stacked on the medium layer 3. An electrode structure including an IDT electrode 5 is disposed on the piezoelectric body 4.

The supporting substrate 2 preferably is composed of an appropriate material capable of supporting the medium layer 3 and the piezoelectric body 4. Examples of such a material that can be used include insulating ceramics, such as glass and alumina, and crystals of $LiNbO_3$ and the like. In the case where a crystal of $LiNbO_3$ or the like is used, it is desirable to use a low-grade and inexpensive crystal because the crystal is not used as a piezoelectric body.

The piezoelectric body 4 is provided in order to excite an elastic wave when an A/C electric field is applied to the IDT electrode 5. As the piezoelectric body 4, although not particularly limited, a piezoelectric single crystal, such as $LiTaO_3$, $LiNbO_3$, or quartz, can be suitably used. In this preferred embodiment, the piezoelectric body 4 preferably is composed of 42° Y-cut X-propagation $LiTaO_3$ with Euler angles of (0°, 132°, 0').

Figure 1B:
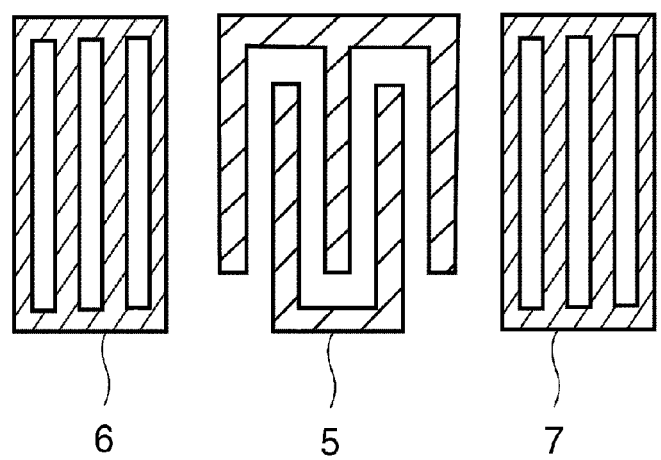
FIG. 1B is a schematic plan view showing an electrode structure thereof.

The IDT electrode 5 can be made of any appropriate metal, such as Al, Cu, Au, Ag, Pt, W, or Mo, or an alloy mainly composed of any one of these metals. The IDT electrode 5 may be formed of a multilayer metal film in which a plurality of metal films are stacked. In this preferred embodiment, the IDT electrode 5 is preferably composed of Al. Furthermore, the electrode structure is not particularly limited. For example, as shown in FIG. 1B, a structure in which reflectors 6 and 7 are arranged on both sides in the elastic wave propagation direction of the IDT electrode 5 may be used. In this case, a surface acoustic wave resonator can be configured in accordance with various preferred embodiments of the present invention.

The elastic wave device 1 according to this preferred embodiment preferably is configured such that the medium layer 3 is disposed on a surface of the piezoelectric body 4 opposite to the surface on which the IDT electrode 5 is provided. That is, the medium layer 3 is disposed between the supporting substrate 2 and the piezoelectric body 4.

The medium layer 3 in this preferred embodiment is preferably composed of a composite medium prepared by mixing a low-velocity medium and a high-velocity medium. In this preferred embodiment, the medium layer 3 is preferably composed of a mixed material of silicon oxide and silicon nitride. Silicon nitride corresponds to the high-velocity medium, and silicon oxide corresponds to the low-velocity medium. By providing the medium layer 3, the main vibration mode with the intermediate acoustic velocity described above propagates in the elastic wave device 1.

In the elastic wave device 1, since the medium layer 3 is provided, even if the thickness of the piezoelectric body 4 varies, frequency variations of the elastic wave device 1 are decreased or prevented. In addition, it is possible to obtain a large electromechanical coupling coefficient $k^2$. This will be described in detail below.

In the following description, the thickness of the composite medium layer preferably is set to $3\lambda$ or about $3\lambda$, for example. The thickness of the piezoelectric body 4 composed of 42° Y-cut X-propagation $LiTaO_3$ is preferably set to $0.5\lambda$ or about $0.5\lambda$, for example. The thickness of the IDT electrode 5 composed of Al preferably is set to $0.08\lambda$ or about $0.08\lambda$, for example. In the composite medium layer having such a structure, relationships between the mixing ratio of silicon oxide and silicon nitride and each of the acoustic velocity Vm of the surface acoustic wave, the electromechanical coupling coefficient $k^2$, the propagation loss $\alpha$, the power flow angle PFA, the vibration displacement, and the impedance characteristics were determined.

The elastic wave device 1 according to this preferred embodiment uses the fundamental mode of an SH-type surface acoustic wave mainly composed of an SH wave. Consequently, the higher-order mode of the SH-type surface acoustic wave and the Rayleigh wave become spurious.

In this preferred embodiment, the medium layer 3 formed of a composite medium layer is preferably composed of a mixed material of silicon nitride and silicon oxide as described above.

Figure 2:
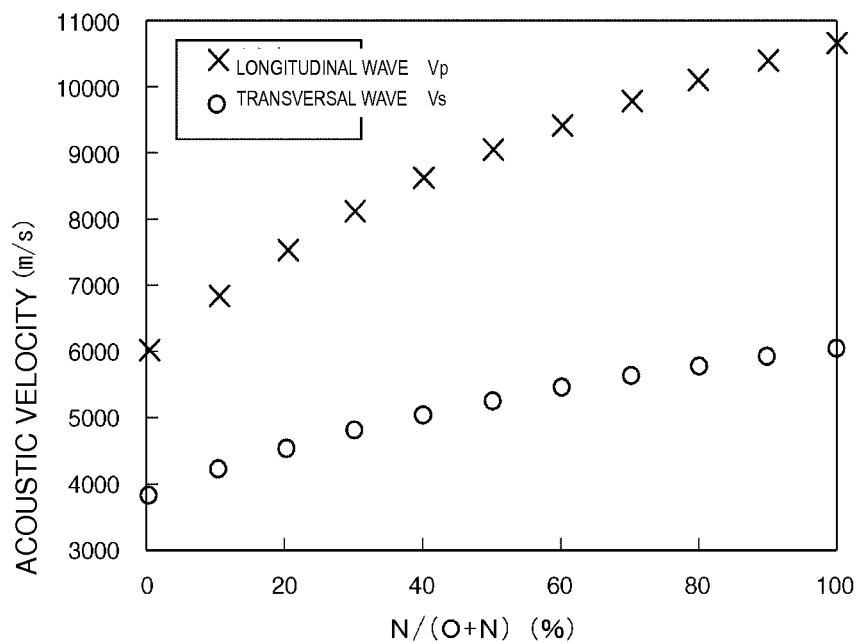
FIG. 2 is a graph showing the relationship between the ratio N/(O+N) (%) and the acoustic velocity of each of the longitudinal and transversal waves in a composite medium composed of SiON.

FIG. 2 shows changes in the acoustic velocity in the case where the mixing ratio N/(O+N) is changed. The mixing ratio N/(O+N)(%) is an abbreviation of the ratio (% by weight) of silicon nitride to the sum of silicon nitride and silicon oxide.

The acoustic velocity Vs of the S wave in silicon nitride is 5,973 m/sec, and the acoustic velocity Vs of the S wave in silicon oxide is 3,757 m/sec. Furthermore, the acoustic velocity Vp of the P wave in silicon nitride is 10,642 m/sec, and the acoustic velocity Vp of the P wave in silicon oxide is 5,960 m/sec.

As is evident from FIG. 2, by changing the mixing ratio N/(O+N), the acoustic velocities Vp and Vs is changed. That is, the acoustic velocity of silicon oxynitride $SiO_xN_y$ (where x and y are each an integer), which is a mixture of silicon oxide and silicon nitride, is an intermediate value between the acoustic velocity of silicon oxide and the acoustic velocity of silicon nitride. By adjusting the mixing ratio N/(O+N), the acoustic velocities of the P wave, which is a longitudinal wave, and the S wave, which is a transversal wave, are adjusted. In particular, as shown in FIG. 2, by increasing the mixing ratio, the acoustic velocity Vp of the P wave and the acoustic velocity Vs of the S wave are increased.

Furthermore, the relationships between the composition of the silicon oxynitride $SiO_xN_y$ and each of the elastic constants $C_{11}$ and $C_{12}$, the density $\rho$, and the dielectric constant $\in 11$ are shown in Table 1 below.

TABLE 1

| Material | O [%] | N [%] | $C_{11}$ [$\times 10^{11} N/m^2$] | $C_{12}$ [$\times 10^{11} N/m^2$] | $\rho$ [$kg/m^3$] | $\in 11$ |
|---|---|---|---|---|---|---|
| $SiO_2$ | 100 | 0 | 0.7850 | 0.1610 | 2210 | 3.750 |
| $SiO_xN_y$ | 90 | 10 | 1.0689 | 0.2789 | 2309 | 4.105 |
| $SiO_xN_y$ | 80 | 20 | 1.32528 | 0.3968 | 2408 | 4.460 |
| $SiO_xN_y$ | 70 | 30 | 1.6367 | 0.5147 | 2507 | 4.815 |
| $SiO_xN_y$ | 60 | 40 | 1.9206 | 0.6326 | 2606 | 5.170 |
| $SiO_xN_y$ | 50 | 50 | 2.2045 | 0.7505 | 2705 | 5.525 |
| $SiO_xN_y$ | 40 | 60 | 2.4884 | 0.8684 | 2804 | 5.880 |
| $SiO_xN_y$ | 30 | 70 | 2.7723 | 0.9863 | 2903 | 6.235 |
| $SiO_xN_y$ | 20 | 80 | 3.0562 | 1.1042 | 3002 | 6.590 |
| $SiO_xN_y$ | 10 | 90 | 3.3401 | 1.2221 | 3101 | 6.945 |
| $Si_3N_4$ | 0 | 100 | 3.6240 | 1.3400 | 3200 | 7.300 |

Note that x and y in the silicon oxynitride $SiO_xN_y$ film is obtained by calculation on the basis of silicon oxide $SiO_2$ and silicon nitride $Si_3N_4$. In Table 1, when N is 0%, the material is silicon oxide $SiO_2$. Furthermore, O(%) indicates the mixing ratio of silicon oxide $SiO_2$.

Using the medium layer 3 formed of the composite medium layer described above, the acoustic velocity Vm of the surface acoustic wave, the electromechanical coupling coefficient $k^2$, and the propagation loss $\alpha$ in the elastic wave device 1 were obtained, under the conditions described above, by the calculation method described below.

Here, the calculation was made in accordance with the method disclosed in the document "A method for estimating optimal cuts and propagation directions for excitation and propagation directions for excitation of piezoelectric surface waves" (J. J. Campbell and W. R. Jones, IEEE Trans. Sonics and Ultrason., Vol. SU-15 (1968) pp. 209-217). In the case of an open boundary, it was considered that there were no normal components of displacement, electric potential, and electric flux density at the boundary between the IDT electrode 5 and the piezoelectric body 4. The stress in the vertical direction was regarded as being continuous, and reflection of elastic waves was not considered to occur at the interface between the medium layer 3 and the supporting substrate 2. The relative dielectric constant of Al serving as the IDT electrode 5 was regarded as 1. Under these conditions, the acoustic velocity and the propagation loss were obtained. In the case of a short-circuit boundary, the electric potential at the boundary between the IDT electrode 5 and the piezoelectric body 4 was regarded as 0.

The electromechanical coupling coefficient $k^2$ was obtained from the formula (1) below. In the formula (1), Vf is the acoustic velocity at an open boundary. Vm is the acoustic velocity in the case where metallization is performed, namely, in the elastic wave device 1 having the IDT electrode 5.

$$K^2 = 2 \times |Vf - Vm|/Vf \quad (1)$$

Figure 3:
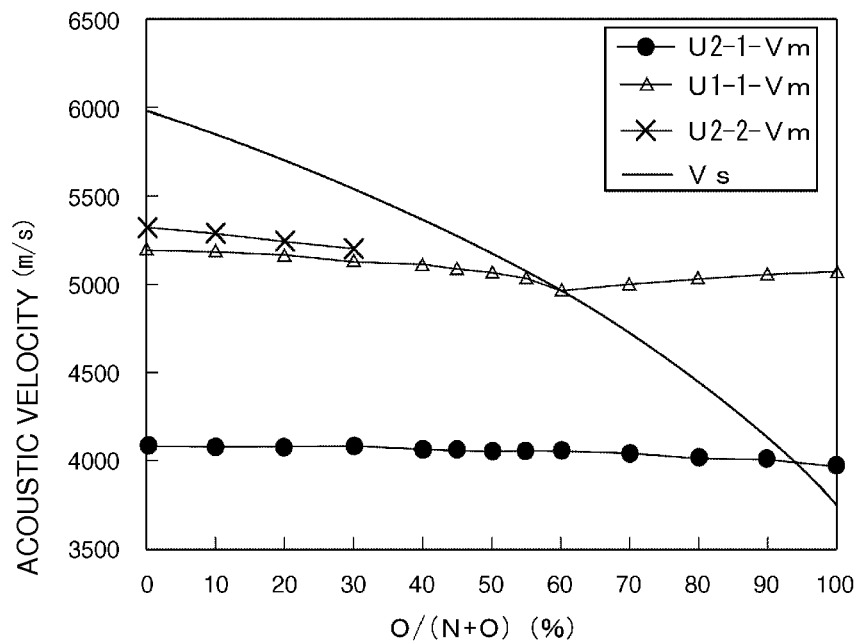
FIG. 3 is a graph showing the relationship between the ratio O/(N+O) (%) and the acoustic velocity of each of the U2-1, U1-1, and U2-2 modes in an elastic wave device having a structure in which a medium layer composed of SiON is stacked on 42° Y-cut X-propagation LiTaO$_3$.
Figure 4:
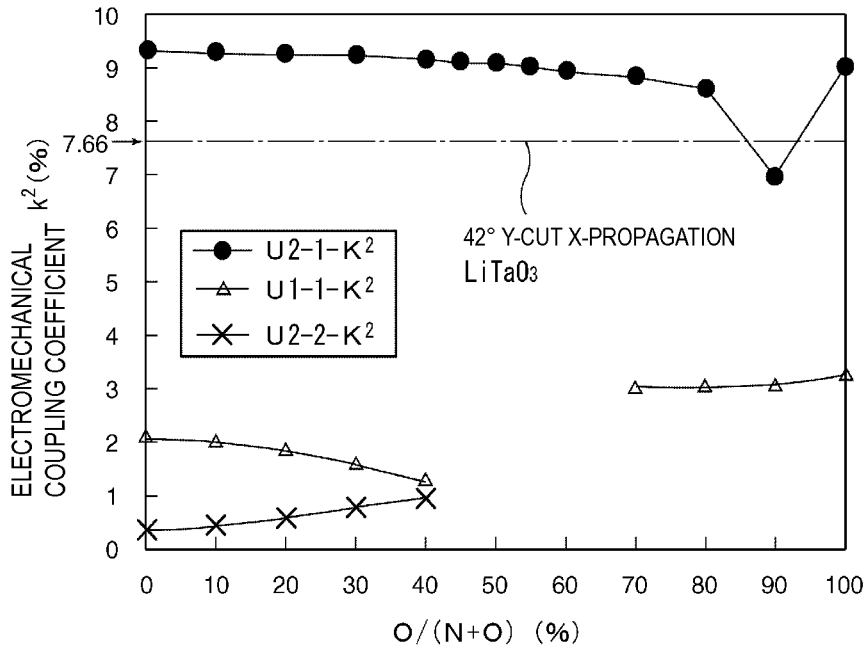
FIG. 4 is a graph showing the relationship between the ratio O/(N+O) (%) and the electromechanical coupling coefficient $k^2$ of each of the U2-1, U1-1, and U2-2 modes in an elastic wave device having a structure in which a medium layer composed of SiON is stacked on 42° Y-cut X-propagation LiTaO$_3$.
Figure 5:
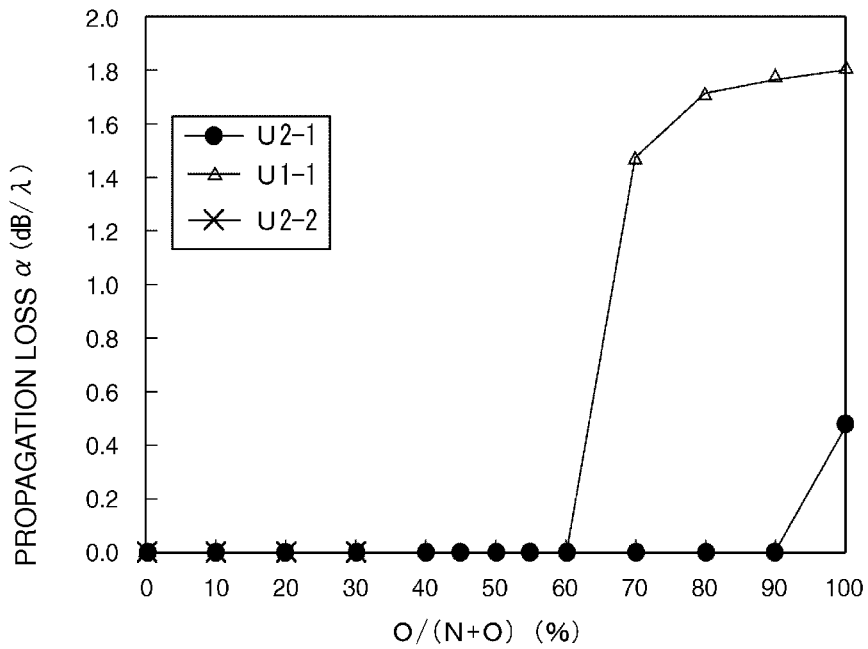
FIG. 5 is a graph showing the relationship between the ratio O/(N+O) (%) and the propagation loss α of each of the U2-1, U1-1, and U2-2 modes in an elastic wave device having a structure in which a medium layer composed of SiON is stacked on 42° Y-cut X-propagation LiTaO$_3$.

FIG. 3 is a graph showing the relationship between the mixing ratio O/(N+O) obtained as described above and the acoustic velocity of each of the vibration components in the elastic wave device 1. FIG. 4 is a graph showing the relationship between the mixing ratio and the electromechanical coupling coefficient $k^2$, and FIG. 5 is a graph showing the relationship between the mixing ratio and the propagation loss α. In FIGS. 3 to 5, U1-1 represents the Rayleigh wave mainly composed of the P wave and the SV wave. U2-1 represents the fundamental mode of the SH-type surface acoustic wave of the SH wave and is the elastic wave used in the elastic wave device 1. U2-2 represents the higher-order mode of the SH-type surface acoustic wave. As described above, since the fundamental mode of the SH-type surface acoustic wave, i.e., U2-1, is used, U2-2 and U1-1 are modes which are spurious.

As is evident from FIG. 3, when the ratio O/(N+O) exceeds about 60%, the acoustic velocity of the U1-1 mode becomes higher than the velocity Vs of the transversal wave. Consequently, when the mixing ratio is about 60% or more, the Rayleigh wave is the leaky mode. Therefore, the mixing ratio O/(N+O) is preferably about 60% or more, for example.

Furthermore, FIG. 5 shows that when the mixing ratio O/(N+O) is about 60% or more, the propagation loss α of the U1-1 mode which is spurious, i.e., the Rayleigh wave, increases. Consequently, the response of the Rayleigh wave which is spurious is decreased.

In the case where the medium layer 3 is not provided, namely, in 42° Y-cut X-propagation $LiTaO_3$, the electromechanical coupling coefficient $k^2$ is 7.7%. As is evident from FIG. 4, when the mixing ratio O/(N+O) is in the range of about 85% or less and in the range of about 93% or more and 100% or less, the electromechanical coupling coefficient $k^2$ is increased by providing the medium layer 3 compared with the case where the medium layer 3 is not provided.

FIGS. 6A and 6B to FIG. 9 are graphs showing impedance characteristics when the mixing ratio in the elastic wave device 1 is changed.

Figure 6A:
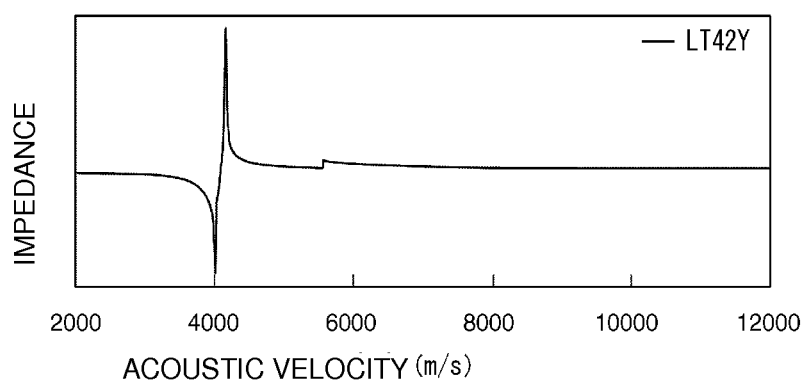
FIG. 6A is a graph showing impedance characteristics of an elastic wave device of a comparative example which does not have a medium layer composed of SiON.
Figure 6B:
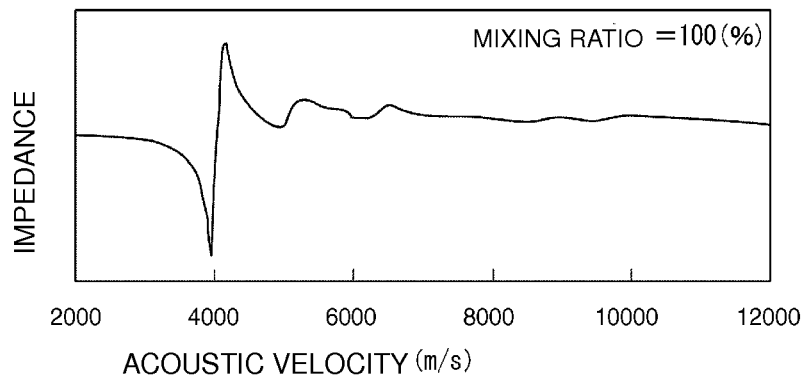
FIG. 6B is a graph showing impedance characteristics in the case where the ratio O/(N+O) in SiON is 100%.
Figure 8A:
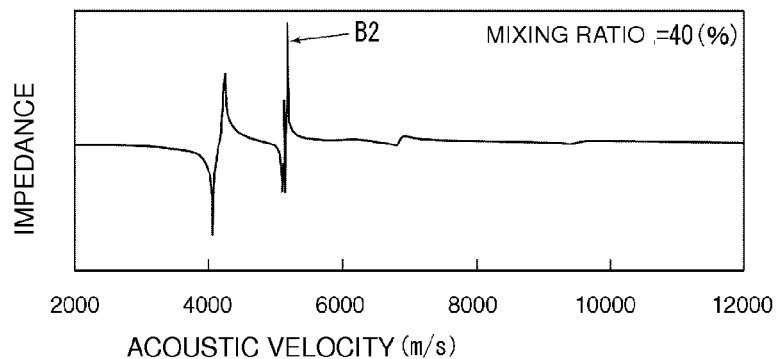
FIGS. 8A and 8B are graphs showing impedance characteristics in the case where the ratio O/(N+O) in a medium layer composed of SiON is 40% by weight and 20% by weight, respectively.
Figure 8B:
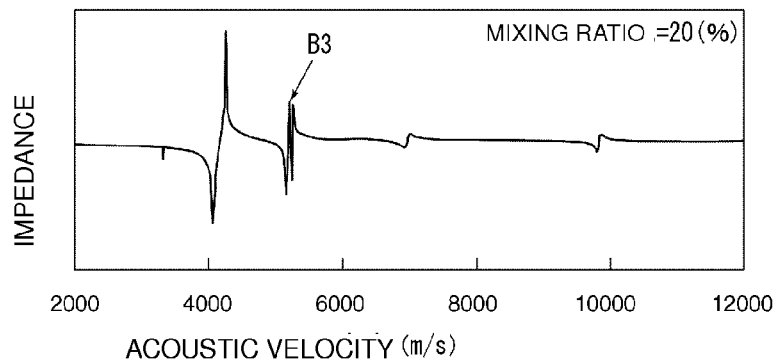
Figure 9:
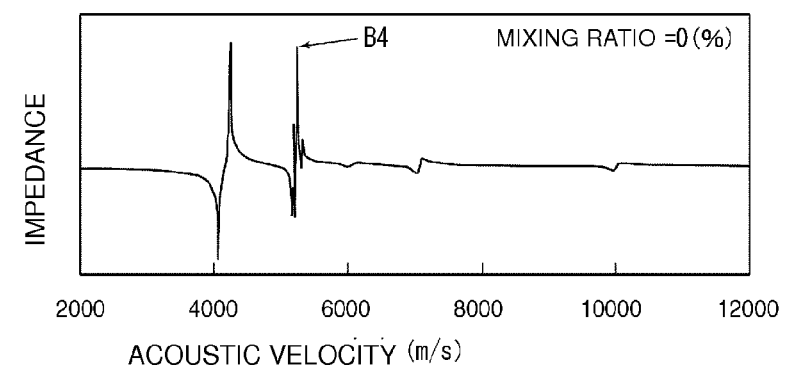
FIG. 9 is a graph showing impedance characteristics in the case where the ratio O/(N+O) in a medium layer composed of SiON is 0%, namely, the medium layer is composed of SiN.

FIG. 6A shows the impedance characteristics of 42° Y cut X-propagation $LiTaO_3$ not provided with the medium layer 3. FIGS. 6B, 7A, 7B, 8A, and 8B show the results when the mixing ratio is approximately 100, 80, 60, 40, and 20(%), respectively. FIG. 9 shows the results when the mixing ratio is 0, namely, in the case where the medium layer is composed of silicon nitride.

In FIGS. 7B, 8A, 8B, and 9, large spurious responses indicated by arrows B1 to B4 appear. The spurious responses are caused by U2-2 or U1-1.

That is, in the case where the mixing ratio O/(N+O) is, for example, about 20% or about 40%, as shown in FIG. 3, the acoustic velocity of each of the U1-1 and U2-2 modes which are spurious is lower than the acoustic velocity Vs of the transversal wave. Consequently, the higher-order modes of the SH-type surface acoustic wave and the Rayleigh wave do not become leaky modes. Furthermore, as is evident from FIG. 5, the propagation loss of the U1-1 mode, i.e., the Rayleigh wave, and the propagation loss of the higher-order mode of the SH-type surface acoustic wave are small. In addition, as is evident from FIG. 4, the electromechanical coupling coefficients of the U1-1 mode and U2-2 mode which are spurious are about 2% and about 0.3% to about 0.8%, respectively. Therefore, as shown in FIGS. 8A and 8B, spurious responses B2 and B3 due to these modes appear.

Figure 7A:
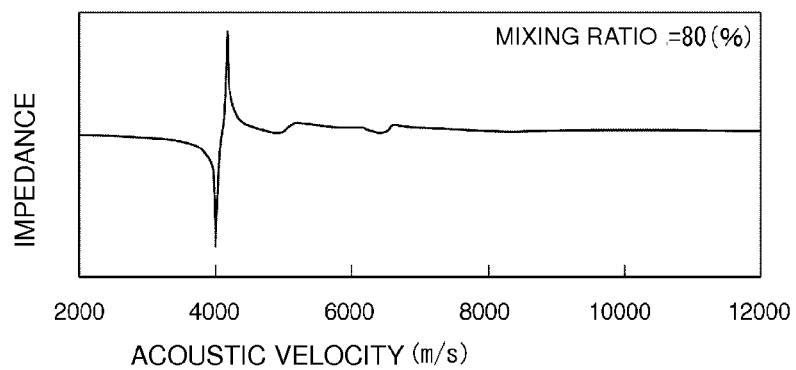
FIGS. 7A and 7B are graphs showing impedance characteristics in the case where the ratio O/(N+O) in a medium layer composed of SiON is 80% by weight and 60% by weight, respectively.
Figure 7B:
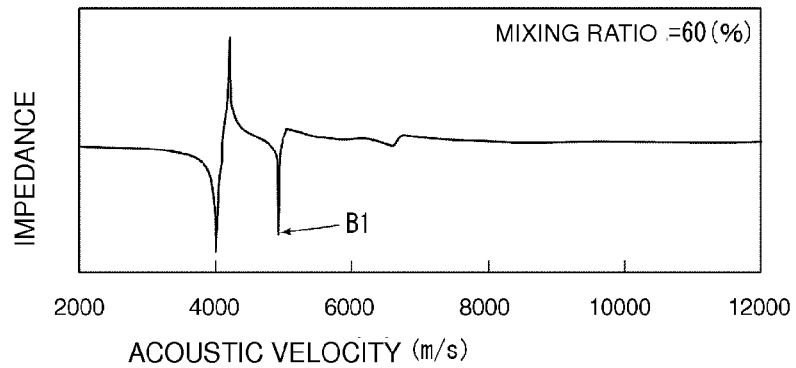

In contrast, when the acoustic velocity of the SH-type surface acoustic wave comes close to the acoustic velocity of the S wave of silicon oxynitride, as shown in FIG. 7A, the response of the higher-order mode which is spurious is small.

Furthermore, in the case where silicon nitride, which is a high-velocity medium, is used, as shown in FIG. 9, the higher-order mode spurious response increases. Note that the higher-order mode is a mode in which energy concentrates and propagates between the surface of the piezoelectric body composed of $LiTaO_3$ and the interface between the piezoelectric body 4 composed of $LiTaO_3$ and the medium layer 3. This will be described with reference to FIGS. 10 to 18.

Figure 10:
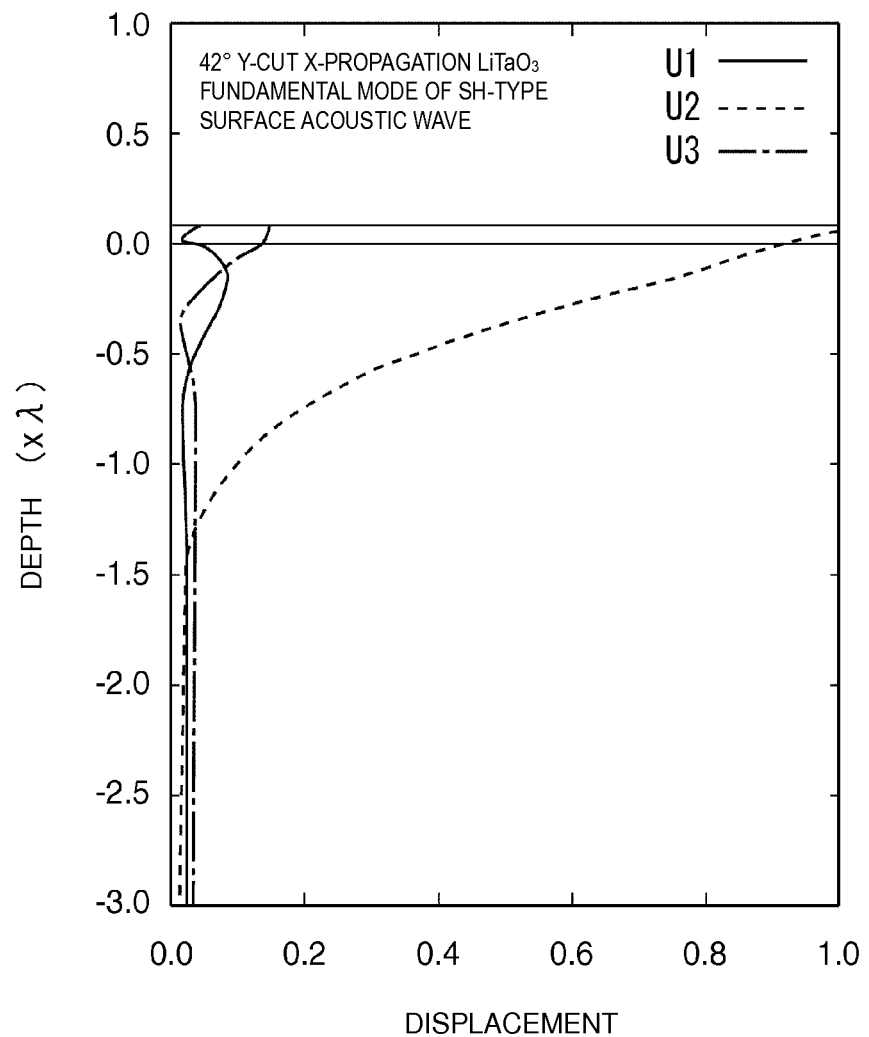
FIG. 10 is a graph showing the energy distribution of the U1 mode, U2 mode, and U3 mode of the fundamental mode in 42° Y-cut X-propagation LiTaO$_3$.

FIG. 10 is a graph showing the energy distribution of the U1 component, U2 component, and U3 component in 42° Y-cut X-propagation $LiTaO_3$ not provided with a medium layer.

The vertical axis in FIGS. 10 to 18 indicates the position in the vertical direction of the elastic wave device, and in FIG. 10, 0 indicates the position of the upper surface of $LiTaO_3$. Furthermore, in FIGS. 11 to 18, 0 indicates the position of the interface between the piezoelectric body and the medium layer. Consequently, the position of +0.5λ corresponds to the position of the surface of the piezoelectric body. Furthermore, FIGS. 10, 11, 13, 15, and 17 show the energy distribution of the U1 to U3 components of the fundamental mode of the elastic wave used, namely, the SH-type surface acoustic wave. On the other hand, FIGS. 12, 14, 16, and 18 show the distribution of the U1 component, U2 component, and U3 component of the higher-order mode of the SH-type surface acoustic wave, which is spurious. FIGS. 11, 13, 15, and 17 show the results in the case where the mixing ratio is approximately 0%, 40%, 80%, and 100%, respectively. Similarly, FIGS. 12, 14, 16, and 18 show the results in the case where the mixing ratio is approximately 0%, 40%, 80%, and 100%, respectively.

As is evident from FIGS. 12, 14, 16, and 18, the higher-order mode, which is spurious, is a mode in which energy concentrates and propagates between the surface of $LiTaO_3$ and the interface between $LiTaO_3$ and the medium layer.

Furthermore, as is evident from FIGS. 11, 13, 15, and 17, the vibration of the fundamental mode of the SH-type surface acoustic wave is distributed not only in $LiTaO_3$ but also in the medium layer. In the elastic wave device 1, the thickness of the medium layer 3 is larger than the thickness in which vibration energy is distributed. Therefore, the fundamental mode of the SH-type surface acoustic wave used is not influenced by the supporting substrate 2 disposed under the medium layer 3. Consequently, even when an inexpensive substrate is used as the supporting substrate 2, the characteristics of the fundamental mode of the SH-type surface acoustic wave are not likely to degrade. As is evident from FIGS. 11, 13, 15, and 17, the thickness of the medium layer 3 only has to be about 1λ. That is, by setting the thickness of the medium layer to 1λ or more, the fundamental mode of the SH-type surface acoustic wave is unlikely to be influenced by the supporting substrate 2.

The acoustic velocity of the fundamental mode of the SH-type surface acoustic wave in 42° Y-cut X-propagation $LiTaO_3$ is 4,036 m/sec, and thus is close to the acoustic velocity of the fundamental mode of the SH-type surface acoustic wave propagating in the elastic wave device 1. The vibration energy of the fundamental mode of the SH-type surface acoustic wave is distributed in the medium layer 3. However, since the acoustic velocity of the fundamental mode of the SH-type surface acoustic wave in the medium layer 3 composed of silicon oxynitride is close to the acoustic velocity of the fundamental mode of the SH-type surface acoustic wave propagating 42° Y-cut X-propagation LiTaO$_3$, even if the thickness of LiTaO$_3$ is changed from about 0.5λ to, for example, about 0.2λ or about 0.8λ, the change in the acoustic velocity of the fundamental mode of the SH-type surface acoustic wave, which is the main propagation mode, is small. That is, in comparison with the structure in which a medium layer made of a high-velocity medium only is in contact with LiTaO$_3$, because of the presence of the medium layer 3, the change in the acoustic velocity of the fundamental mode of the SH-type surface acoustic wave is small. Therefore, according to this preferred embodiment, even if the thickness of the piezoelectric body 4 composed of LiTaO$_3$ varies at the time of production, frequency variations are decreased.

Figure 11:
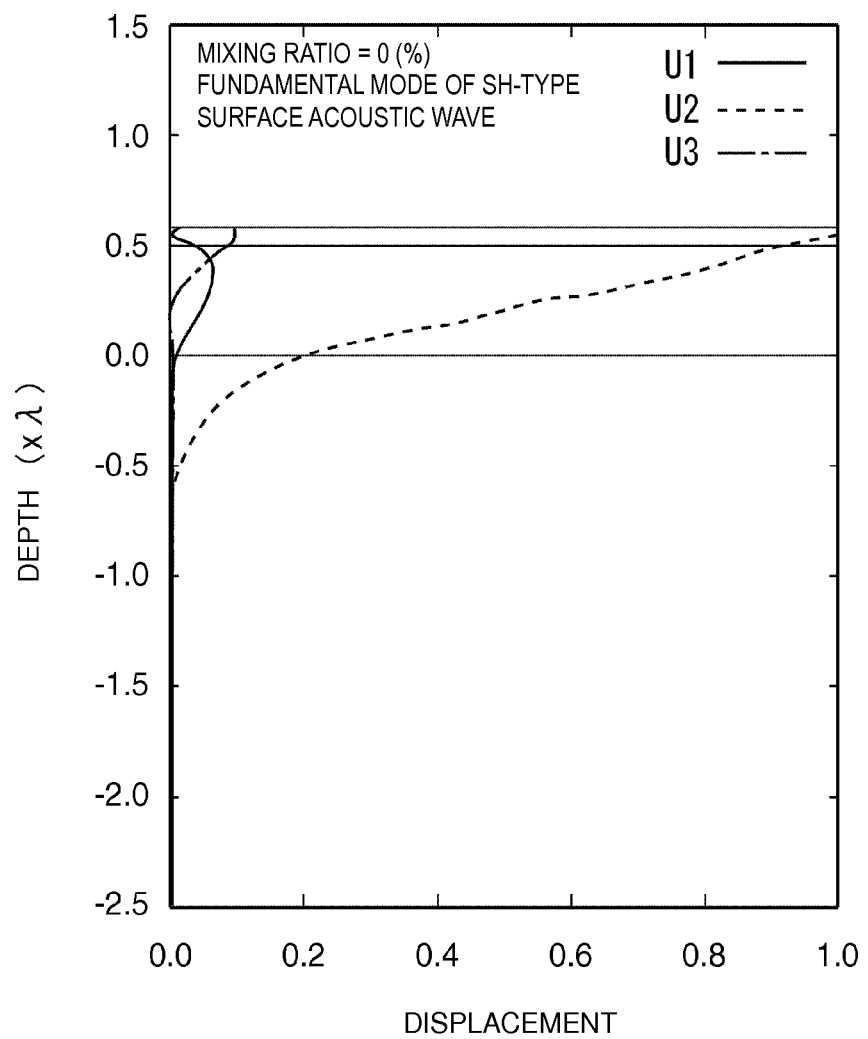
FIG. 11 is a graph showing the energy distribution of the U1 mode, U2 mode, and U3 mode of the fundamental mode in the case where the ratio O/(N+O) in a medium layer composed of SiON is 0%.
Figure 12:
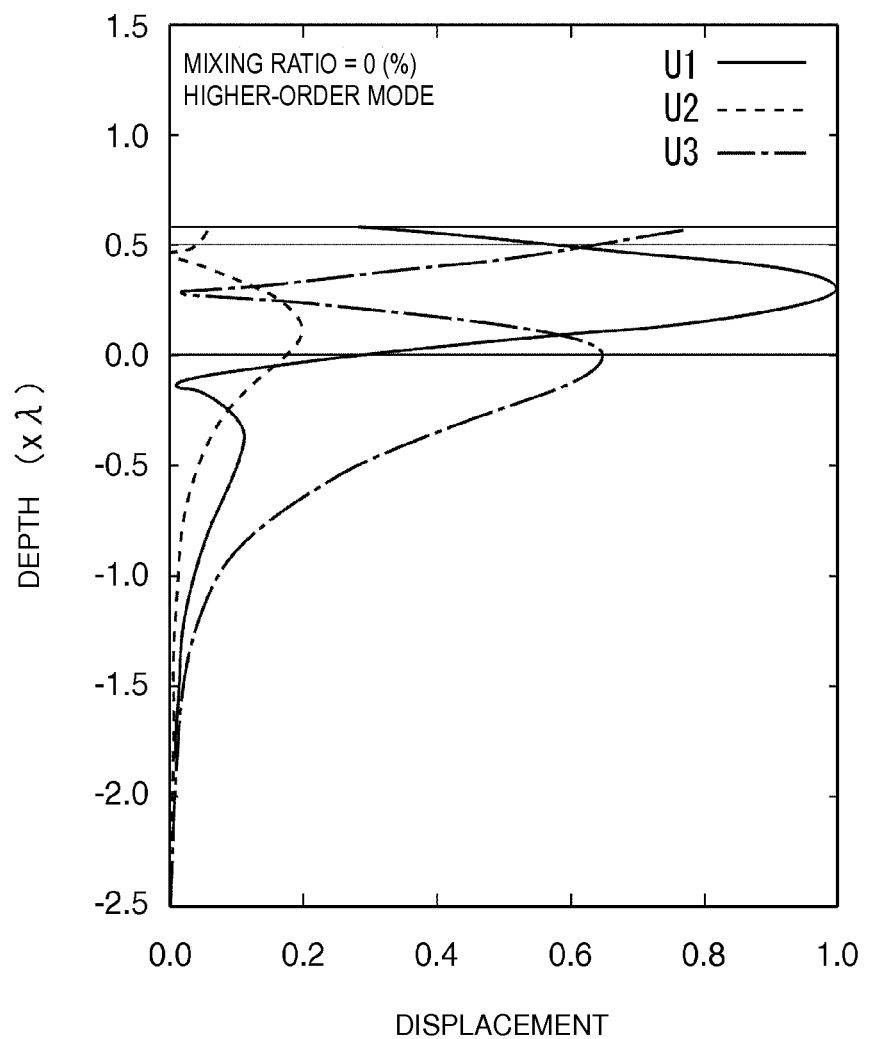
FIG. 12 is a graph showing the energy distribution of the U1 component, U2 component, and U3 component of the higher-order mode, which is spurious, in the case where the ratio O/(N+O) in a medium layer composed of SiON is 0%.
Figure 13:
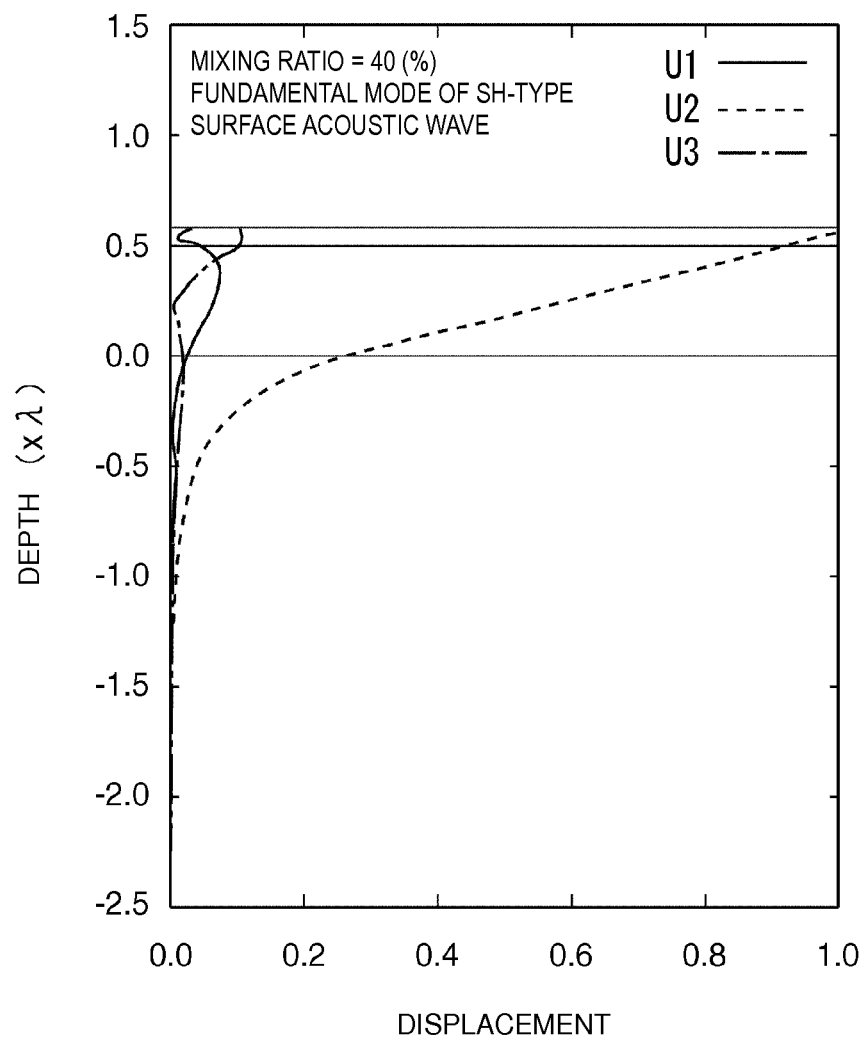
FIG. 13 is a graph showing the energy distribution of the U1 mode, U2 mode, and U3 mode of the fundamental mode in the case where the ratio O/(N+O) in a medium layer composed of SiON is 40%.
Figure 14:
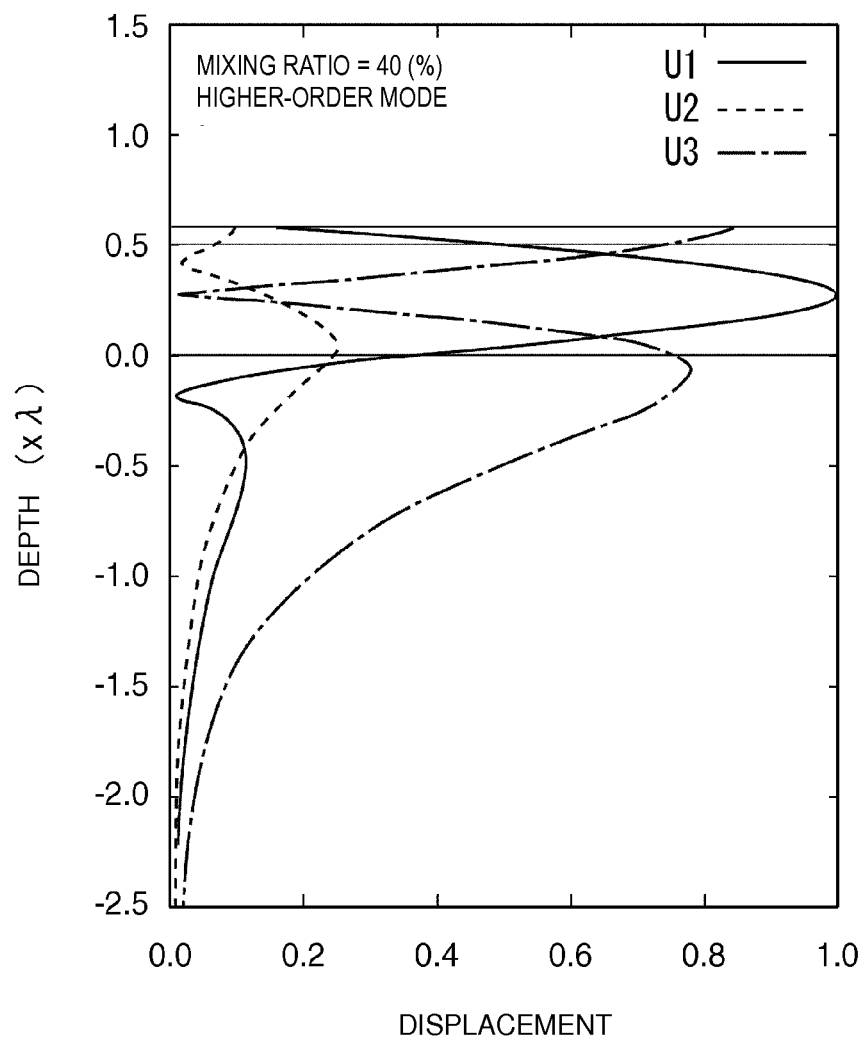
FIG. 14 is a graph showing the energy distribution of the U1 component, U2 component, and U3 component of the higher-order mode, which is spurious, in the case where the ratio O/(N+O) in a medium layer composed of SiON is 40%.
Figure 15:
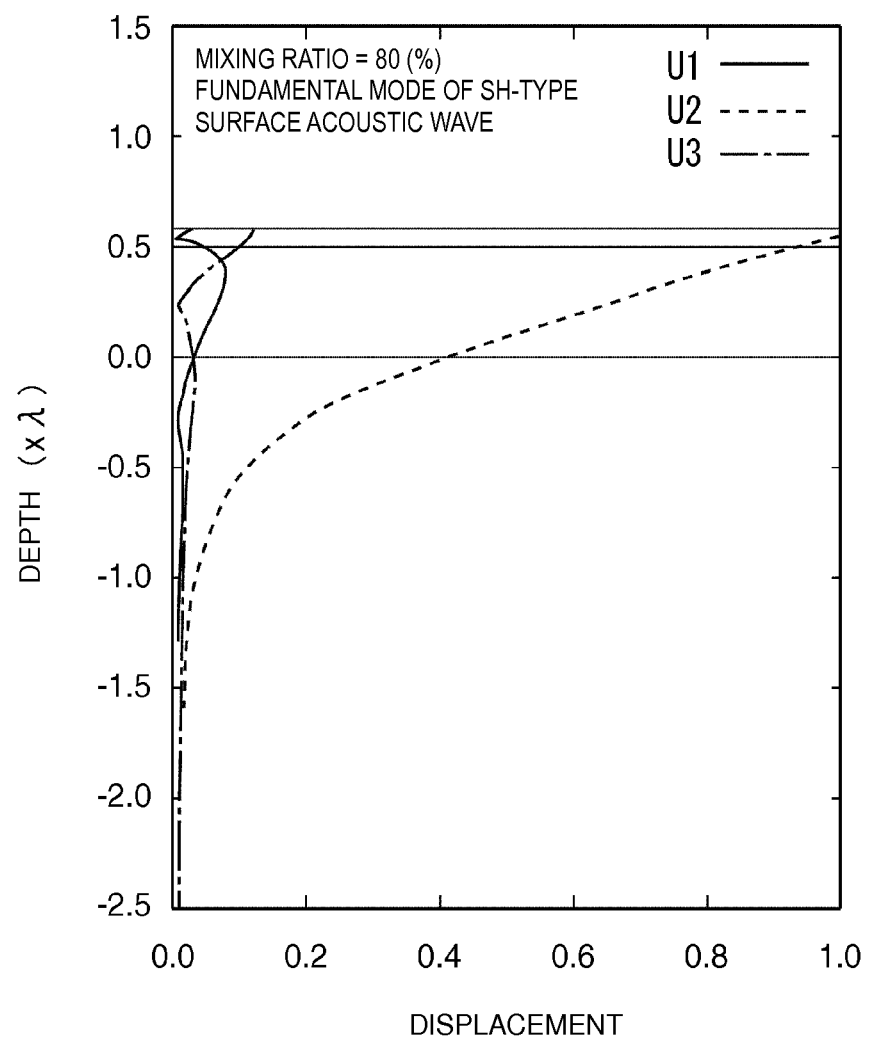
FIG. 15 is a graph showing the energy distribution of the U1 mode, U2 mode, and U3 mode of the fundamental mode in the case where the ratio O/(N+O) in a medium layer composed of SiON is 80%.
Figure 16:
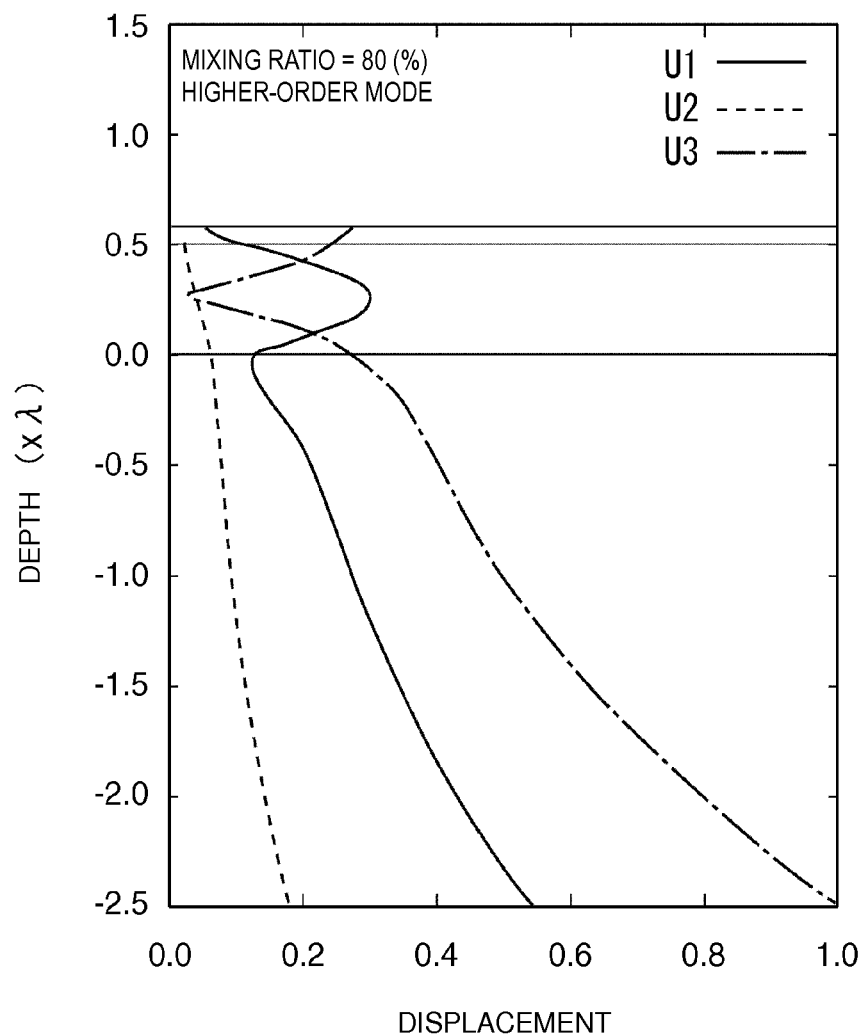
FIG. 16 is a graph showing the energy distribution of the U1 component, U2 component, and U3 component of the higher-order mode, which is spurious, in the case where the ratio O/(N+O) in a medium layer composed of SiON is 80%.
Figure 17:
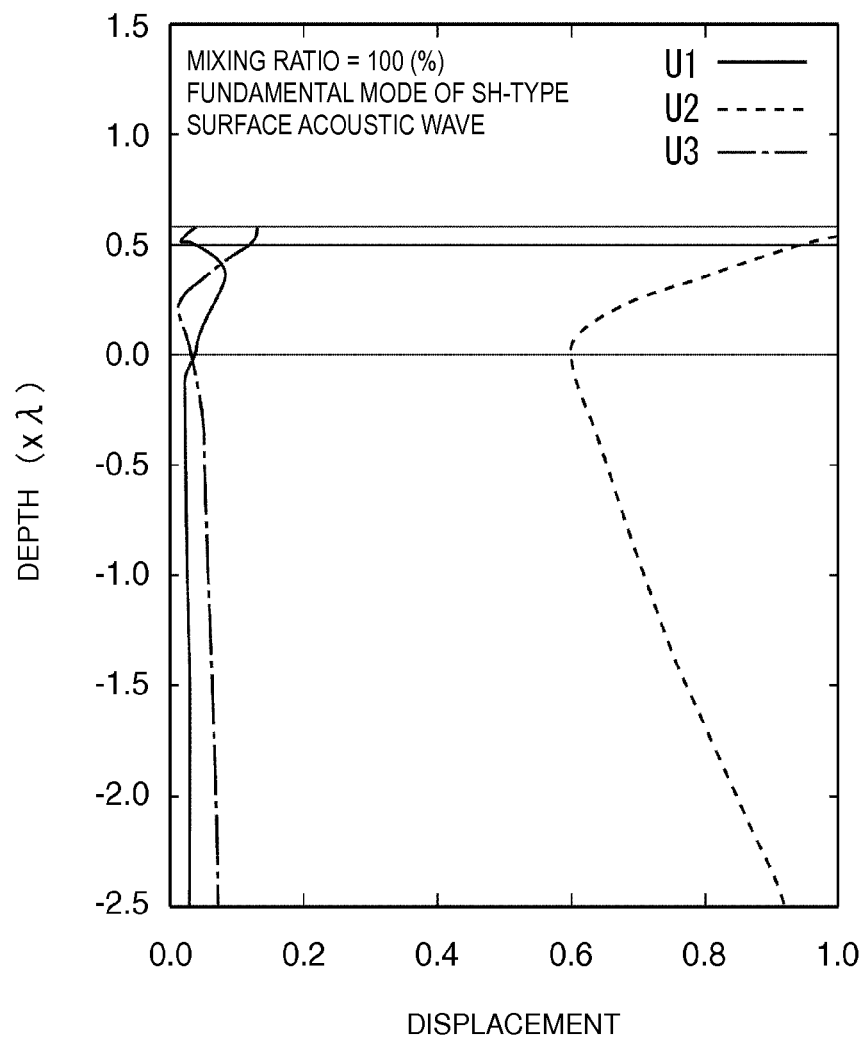
FIG. 17 is a graph showing the energy distribution of the U1 mode, U2 mode, and U3 mode of the fundamental mode in the case where the ratio O/(N+O) in a medium layer composed of SiON is 100%.
Figure 18:
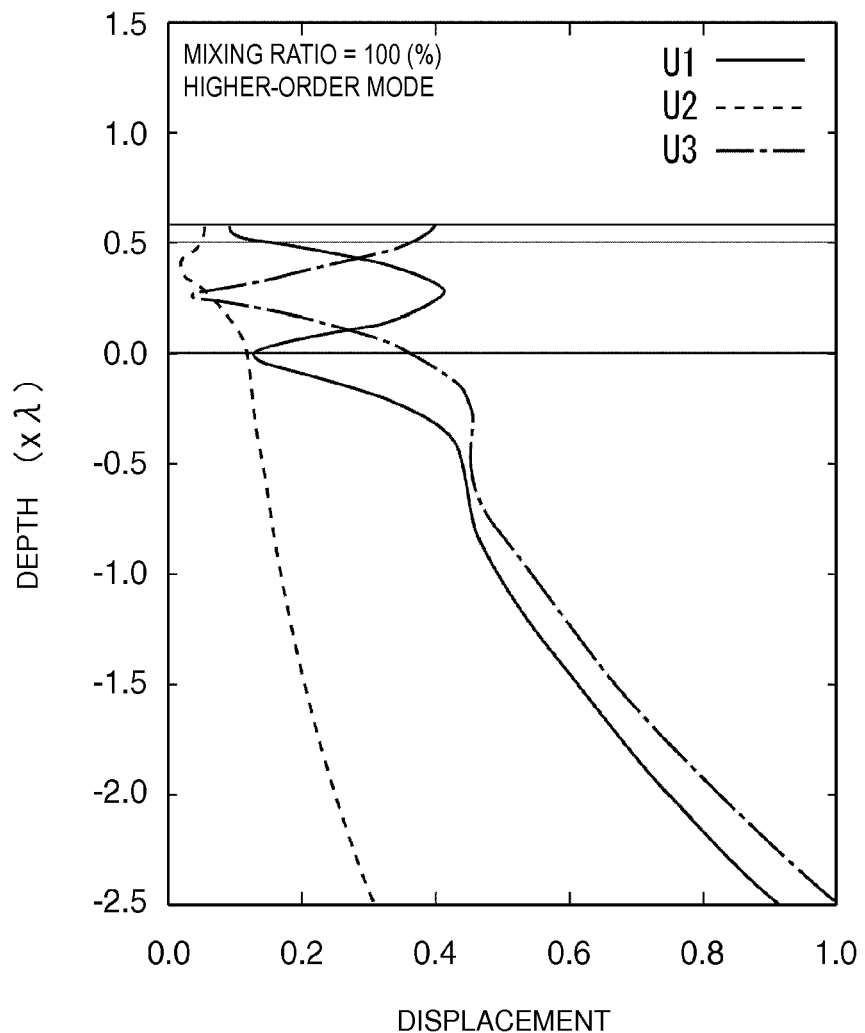
FIG. 18 is a graph showing the energy distribution of the U1 component, U2 component, and U3 component of the higher-order mode, which is spurious, in the case where the ratio O/(N+O) in a medium layer composed of SiON is 100%.

In the case where known 42° Y-cut X-propagation LiTaO$_3$ is used, as described above, the electromechanical coupling coefficient k$^2$ of the SH-type surface acoustic wave is 7.7%. In contrast, as shown in FIG. 4, in the elastic wave device 1 of this preferred embodiment, the electromechanical coupling coefficient is high at about 8% to about 9% over the wide ranges where the mixing ratio O/(N+O) is about 85% or less and about 93% or more as described above, for example. The reason for this is that the medium layer 3 containing silicon oxide and silicon nitride having a low dielectric constant is closely disposed such that the vibration energy of the fundamental mode of the SH-type surface acoustic wave is distributed therein. That is, the parasitic capacitance is decreased, and the electric field strength, which is a driving force, is concentrated on the LiTaO$_3$ side in which the dielectric constant is high. Consequently, as shown in FIGS. 11, 13, and 15, vibration energy is concentrated on the LiTaO$_3$ side. Therefore, the driving force, which is proportional to the electromechanical coupling coefficient k$^2$, increases, the parasitic capacitance, which is inversely proportional to the electromechanical coupling coefficient k$^2$, decreases, and thus the electromechanical coupling coefficient k$^2$ increases.

Figure 19:
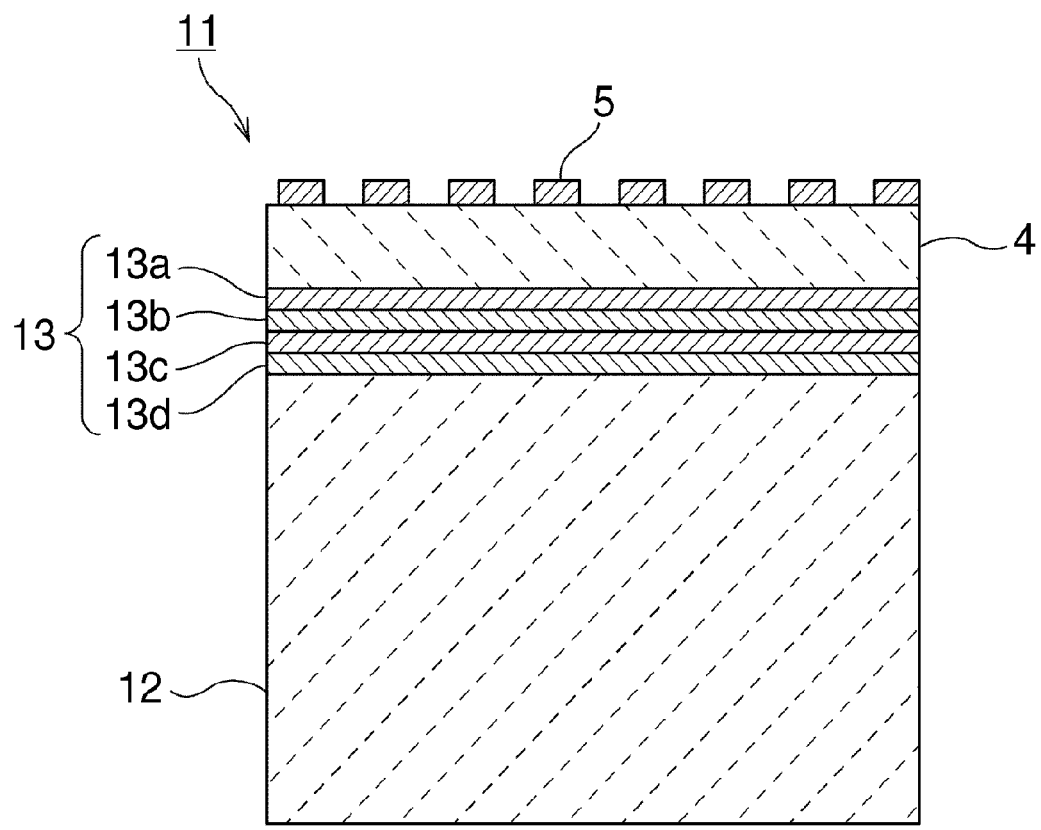
FIG. 19 is a schematic elevational cross-sectional view of an elastic wave device according to another preferred embodiment of the present invention.

FIG. 19 is a schematic elevational cross-sectional view showing an elastic wave device according to a second preferred embodiment of the present invention.

In an elastic wave device 11 shown in FIG. 19, a medium layer 13, a piezoelectric body 4, and an IDT electrode 5 are stacked on a supporting substrate 12. The piezoelectric body 4 and the IDT electrode 5 preferably are the same as those in the first preferred embodiment. That is, the piezoelectric body 4 preferably is composed of 42° Y-cut X-propagation LiTaO$_3$ and has a thickness of about 0.5λ, for example. The IDT electrode 5 preferably is composed of Al and has a thickness of about 0.08λ and a duty of about 0.5, for example.

In this preferred embodiment, the medium layer 13 preferably is defined by a multilayer body including low-velocity medium layers 13a and 13c made of a low-velocity medium and high-velocity medium layers 13b and 13d made of a high-velocity medium. In such a manner, the medium layer according to the present preferred embodiment of the present invention may be a multilayer body in which high-velocity medium layers and low-velocity medium layers are stacked. In this case, the medium layer 13 also preferably includes a low-velocity medium and a high-velocity medium. In the second preferred embodiment, by providing the medium layer 13, the main vibration mode with the intermediate acoustic velocity described above also propagates in the elastic wave device 11.

When a medium layer includes a structure in which a high-velocity medium and a low-velocity medium are stacked in such a manner, the following advantages are obtained.

In the case where the medium layer has a structure of low-velocity medium/high-velocity medium/low-velocity medium, and in the case where the supporting substrate is formed using a low-velocity material, a rough material such that it scatters elastic waves, or a material, such as a resin, that absorbs sound, when energy of the main vibration is distributed to the low-velocity medium layer, the main vibration attenuates. Therefore, it is desirable to confine the main vibration to the high-velocity medium layer. Here, in the case where a high-velocity material in which the attenuation of an elastic wave is small is used for the supporting substrate, by arranging the high-acoustic velocity substrate so as to be in contact with the low-velocity medium layer which is the lowest layer, attenuation of the main vibration is avoided.

In this case, compared with the two-layer structure, such as a structure of low-velocity medium/high-velocity medium, the acoustic velocity is finely adjustable in the structure of low-velocity medium/high-velocity medium/low-velocity medium, thus being more desirable.

In the case where the medium layer has a structure of high-velocity medium/low-velocity medium/high-velocity medium, when compared between the low-velocity medium/high-velocity medium structure and the high-velocity medium/low-velocity medium/high-velocity medium structure, in the case where energy of the main vibration is distributed to the high-velocity medium layer which is the lowest layer, the high-velocity medium/low-velocity medium/high-velocity medium structure adjusts acoustic velocity more finely than the low-velocity medium/high-velocity medium structure, thus being more desirable. In addition, in a method in which, after a high-velocity medium/low-velocity medium/high-velocity medium layer is formed on the back surface of a piezoelectric film, a supporting substrate is bonded thereto, since there is no bonding interface in the region in which energy of the main vibration is distributed, stability is obtained regardless of the bonding state, which is advantageous.

Therefore, in the case where a structure including a high-velocity medium and a low-velocity medium stacked on each other, a structure in which three or more layers are stacked is more preferable.

Figure 20:
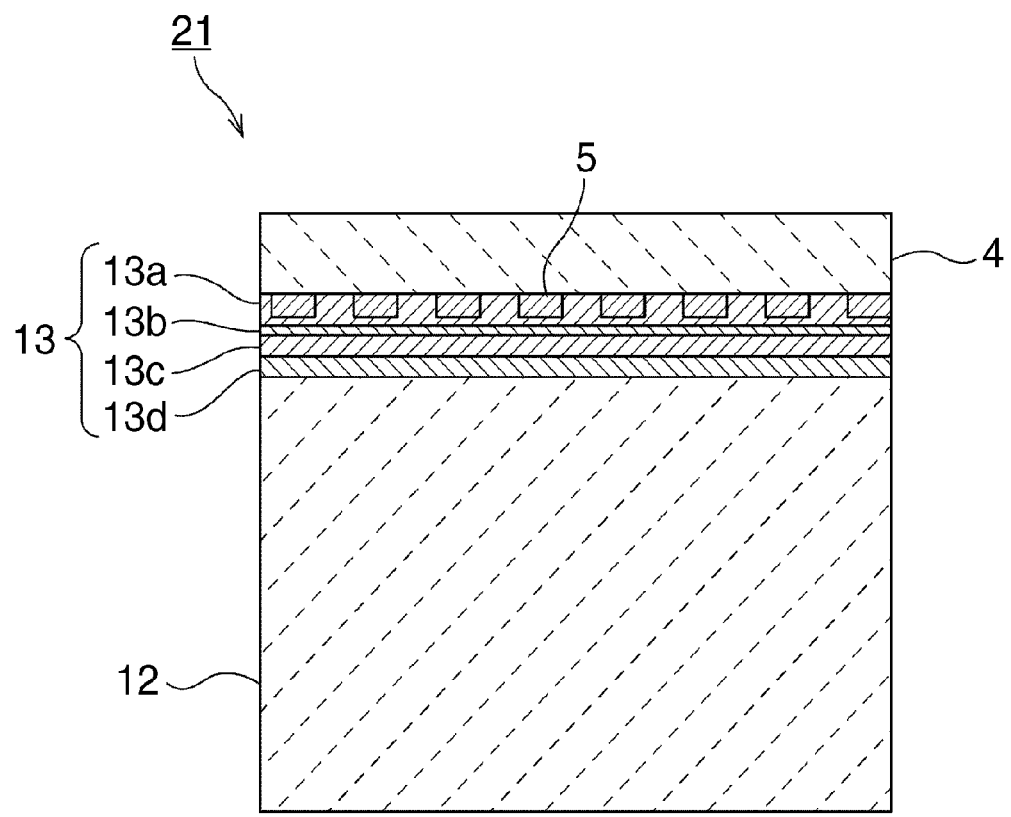
FIG. 20 is a schematic elevational cross-sectional view of an elastic wave device according to another preferred embodiment of the present invention.

FIG. 20 shows an elastic wave device 21 according to a modification example of the second preferred embodiment. This differs from the second preferred embodiment in that an IDT electrode 5 is disposed on the lower surface of a piezoelectric body 4. In such a manner, in a preferred embodiment of the present invention, the IDT electrode 5 may be provided on the lower surface side as long as it is in contact with the piezoelectric body 4.

Figure 21:
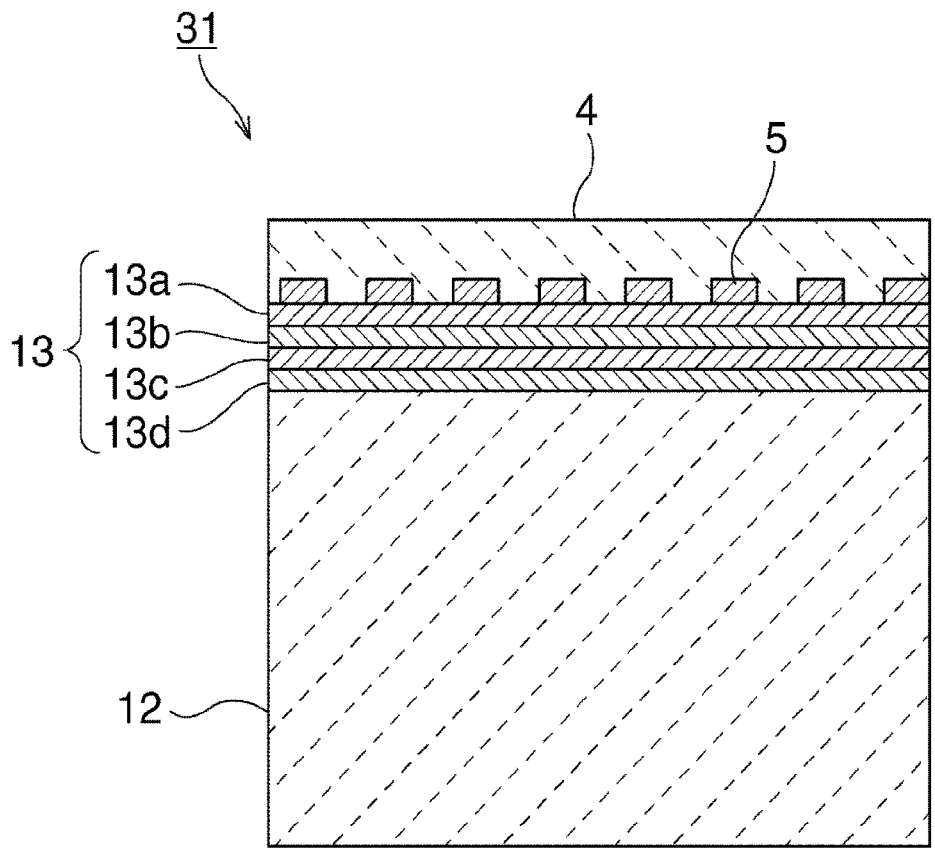
FIG. 21 is a schematic elevational cross-sectional view of an elastic wave device according to another preferred embodiment of the present invention.

FIG. 21 shows an elastic wave device according to another modification example of the second preferred embodiment. In an elastic wave device 31 shown in FIG. 21, an IDT electrode 5 is disposed on a medium layer 13 preferably defined by a multilayer body. A piezoelectric body 4 is arranged so as to cover the IDT electrode 5. In such a manner, the IDT electrode 5 may be disposed on the upper surface of a medium layer 13 preferably defined by a multilayer body.

Furthermore, in the elastic wave device 1 of the first preferred embodiment described above, similarly, the IDT electrode 5 may be disposed on the lower surface of the piezoelectric body 4, or may be disposed on the upper surface of the medium layer 3 preferably defined by a composite medium layer.

FIGS. 22 to 25 are graphs showing the relationship between the number of layers stacked in the medium layer 13 in the elastic wave device 11 according to the second preferred embodiment and characteristics of the fundamental mode of the SH-type surface acoustic wave used. Furthermore, FIGS. 22 to 25 show the results in the case where the ratio between the thickness of a high-velocity medium layer composed of silicon nitride and the thickness of a low-velocity medium layer composed of silicon oxide is changed in a medium layer formed of a multilayer body. In FIGS. 22 to 25, "N/O" indicates the thickness ratio. For example, "N/O=1/9" indicates that the thickness percentage of silicon nitride preferably is about 10% and the thickness percentage of silicon oxide preferably is about 90%.

Figure 22:
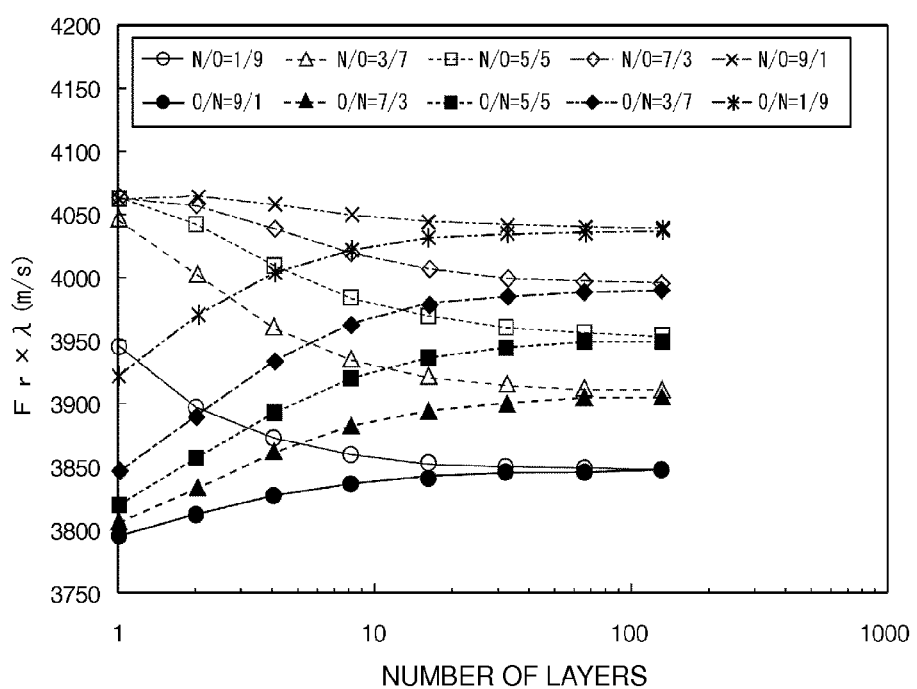
FIG. 22 is a graph showing the relationship between the number of layers stacked, the stacking ratio, and the acoustic velocity in structures in which a medium layer composed of SiON and a low-velocity medium layer composed of SiO$_2$ are stacked.
Figure 23:
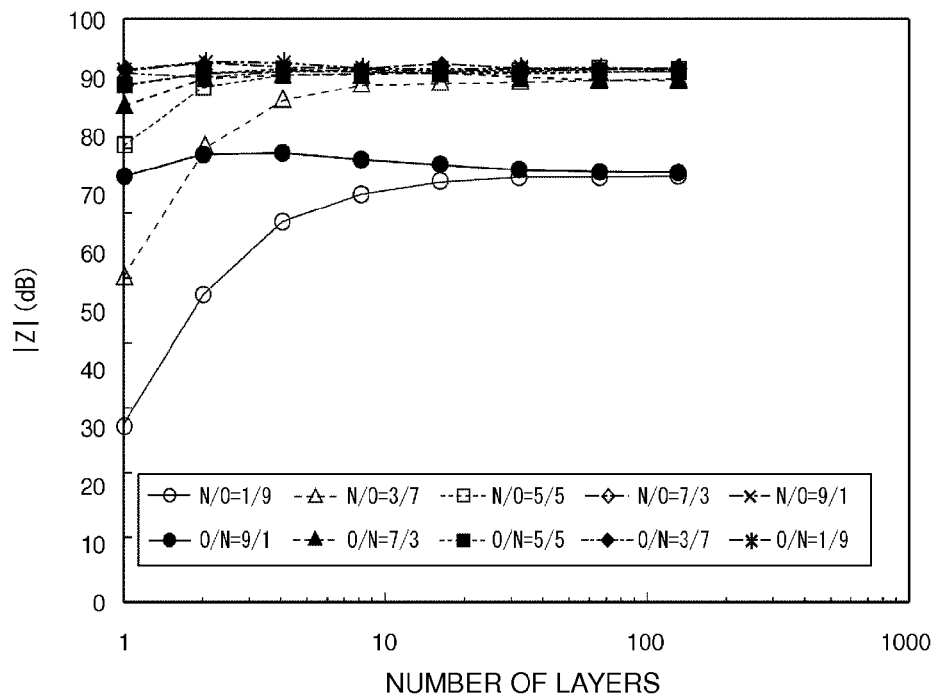
FIG. 23 is a graph showing the relationship between the number of layers stacked, the stacking ratio, and the impedance in structures in which a medium layer composed of SiON and a low-velocity medium layer composed of SiO$_2$ are stacked.
Figure 24:
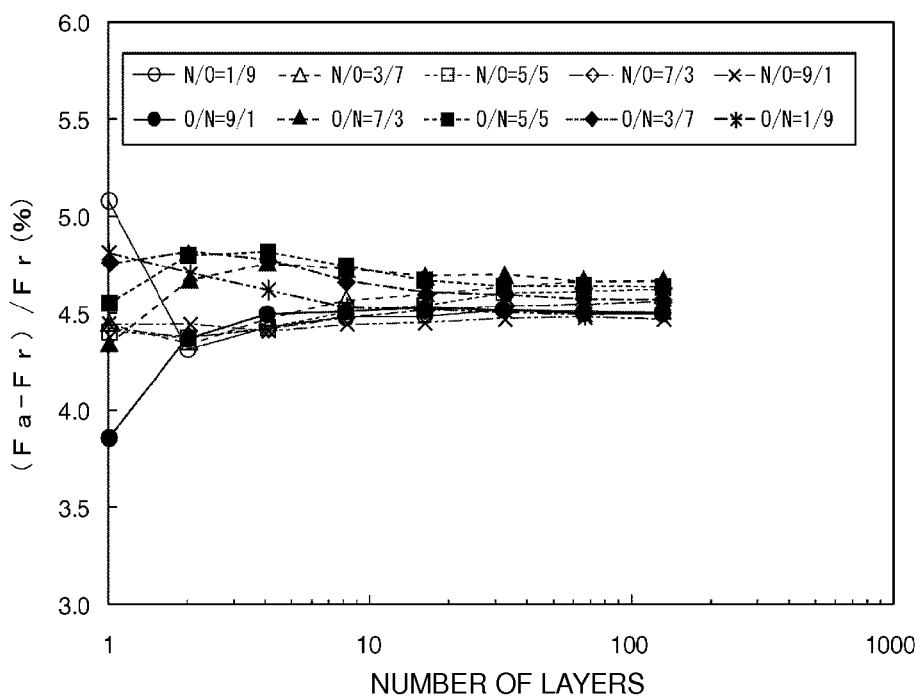
FIG. 24 is a graph showing the relationship between the number of layers stacked, the stacking ratio, and the band width (Fa−Fr)/Fr in structures in which a medium layer composed of SiON and a low-velocity medium layer composed of SiO$_2$ are stacked.
Figure 25:
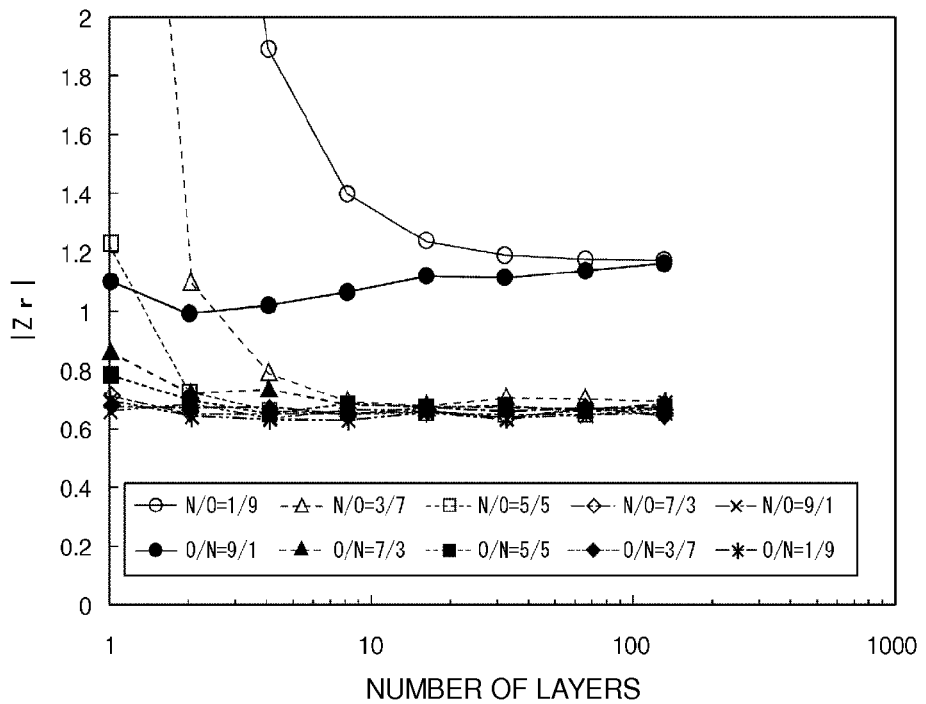
FIG. 25 is a graph showing the relationship between the number of layers stacked, the stacking ratio, and the minimum impedance Zr in structures in which a medium layer composed of SiON and a low-velocity medium layer composed of SiO$_2$ are stacked.

FIG. 22 shows changes in the acoustic velocity of the SH-type surface acoustic wave in the case where the structure of the multilayer body is changed as described above. Furthermore, FIG. 23 shows changes in the impedance Z. FIG. 24 shows changes in the band width ratio (Fa−Fr)/Fr (%). Here, Fa represents the anti-resonant frequency, and Fr represents the resonant frequency. Furthermore, FIG. 25 shows changes in the absolute value of the minimum impedance Zr.

The results shown in FIGS. 22 to 25 were obtained by extending the finite element method proposed in "Finite element method analysis of piezoelectric waveguide with a periodic structure" (Transactions of The Institute of Electronics, Information and Communication Engineers Vol. J68-C No. 1, 1985/1, pp. 21-27). That is, a strip was disposed within a half-wavelength interval, for two intervals. Furthermore, the impedance and capacitance between an electrode finger electrically set at 1 V and an electrode finger set at 0 V were derived. As a result, from the resonant frequency Fr, the anti-resonant frequency Fa, the minimum impedance Zr, and the maximum impedance Za, the impedance ratio |Z|=|Za/Zr| and the band width ratio (Fa−Fr)/Fr were obtained. The acoustic velocity of the surface acoustic wave at the resonant frequency Fr can be obtained using the IDT period $\lambda$, from the expression Fr×$\lambda$ (m/sec).

Most of the vibration energy of the surface acoustic wave concentrates on a region extending from the interface between the IDT electrode and the piezoelectric body to a depth of 1$\lambda$. Consequently, a range of ±4$\lambda$ in the vertical direction of the interface between the IDT electrode and the piezoelectric body, i.e., a thickness range of 8$\lambda$, was examined. The boundary condition of the lower surface of the supporting substrate was considered to be elastically fixed.

In FIGS. 22 to 25, the thickness ratio of the low-velocity medium layer composed of silicon oxide to the high-velocity medium layer composed of silicon nitride is preferably set at approximately 1:9, 3:7, 5:5, 7:3, and 9:1. Intermediate values, such as 2:8, are not plotted. However, it has been confirmed that, for example, in the case of 2:8, the value obtained by taking into consideration the results of 1:9 and 3:7, which are in the vicinity of 2:8, substantially corresponds to the result of 2:8.

Regarding the number of layers stacked in the multilayer body, cases ranging from a structure in which one high-velocity medium layer and one low-velocity medium layer were stacked to a structure in which 128 layers in total were stacked were examined. For example, N/O=1/9 at the number of layers stacked of 1 in FIG. 22 indicates the case where 9 low velocity medium layers composed of silicon oxide are stacked onto one high-velocity medium layer composed of silicon nitride.

Furthermore, FIGS. 22 to 25 show the results of both the case where a low-velocity medium layer is disposed on the piezoelectric body 4 side and the case where a high-velocity medium layer is disposed on the piezoelectric body 4 side. In the graphs, the contents represented by N/O are results in the case where silicon nitride which is a high-velocity medium layer is disposed close to the piezoelectric body 4 composed of $LiTaO_3$, and the contents represented by O/N are results in the case where silicon oxide which is a low-velocity medium layer is disposed close to the $LiTaO_3$ side.

Furthermore, in the case where the multilayer body is composed of silicon nitride only, Fr×$\lambda$ is 4,065 m/sec. In the case where the medium layer is formed of a multilayer body composed of silicon oxide only, Fr×$\lambda$ is 3,785 m/sec.

Figure 26:
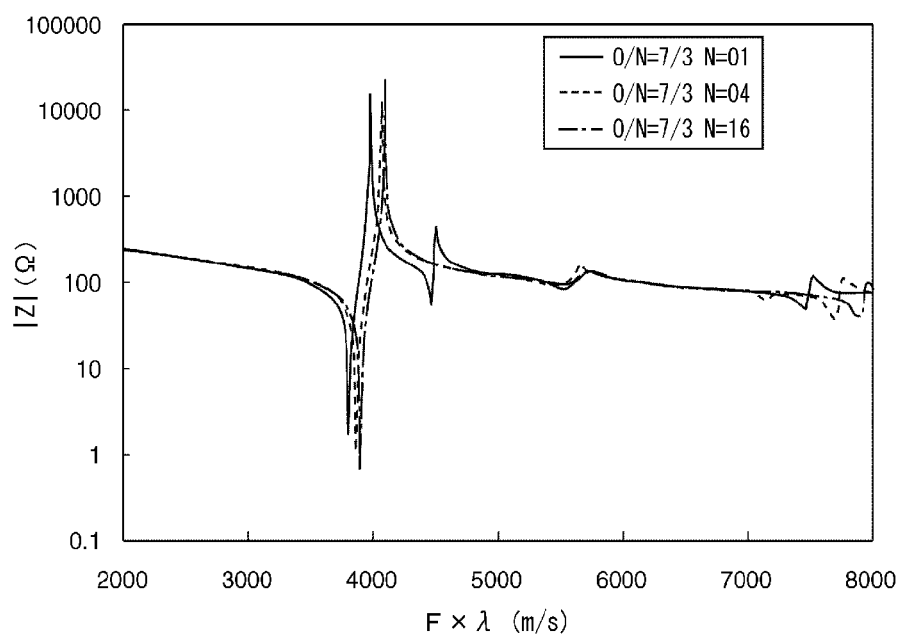
FIG. 26 is a graph showing changes in impedance characteristics when the number of layers stacked is changed in structures including a multilayer body including a low-velocity medium layer composed of SiO$_2$ and a high-velocity medium layer composed of SiN.
Figure 27:
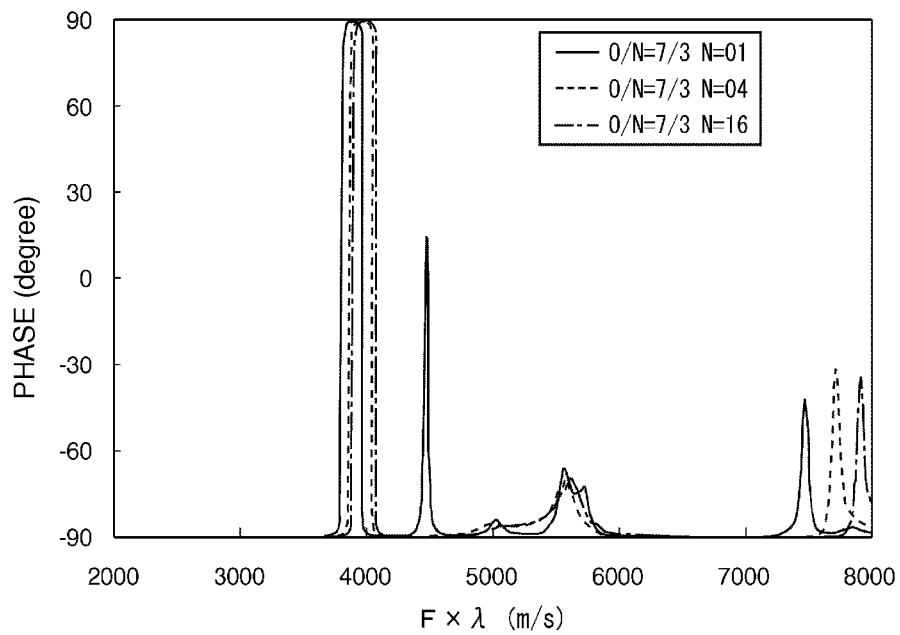
FIG. 27 is a graph showing changes in phase characteristics when the number of layers stacked is changed in structures including a multilayer body including a low-velocity medium layer composed of SiO$_2$ and a high-velocity medium layer composed of SiN.

FIGS. 26 to 29 are graphs showing impedance characteristics and phase characteristics in elastic wave devices configured as in the case of FIGS. 22 to 25. FIGS. 26 and 27 respectively show the impedance characteristics and the phase characteristics of elastic wave devices in the case where silicon oxide which is a low-velocity medium layer is disposed on the $LiTaO_3$ side.

Figure 28:
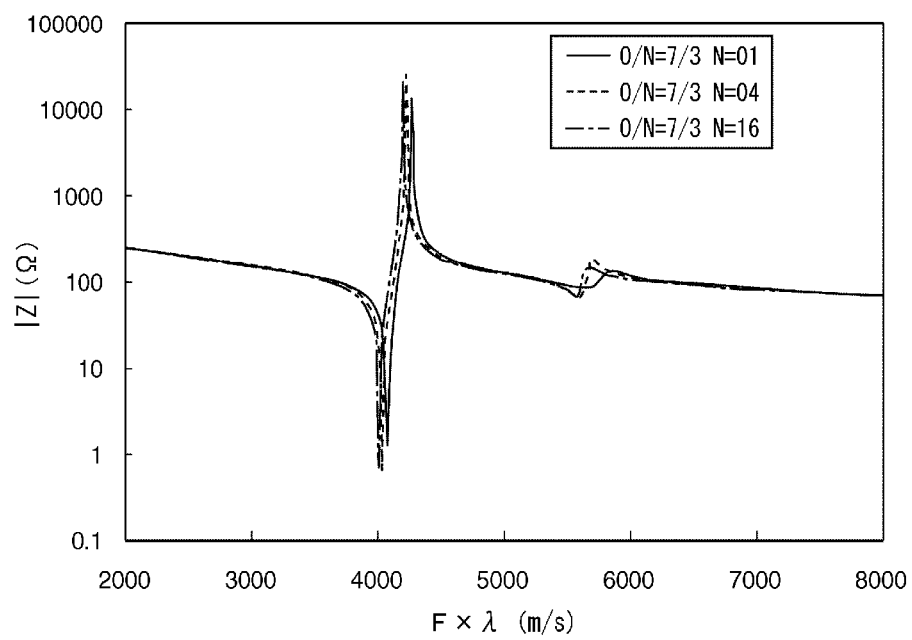
FIG. 28 is a graph showing changes in impedance characteristics when the number of layers stacked is changed in structures including a multilayer body including a low-velocity medium layer composed of $SiO_2$ and a high-velocity medium layer composed of SiN.
Figure 29:
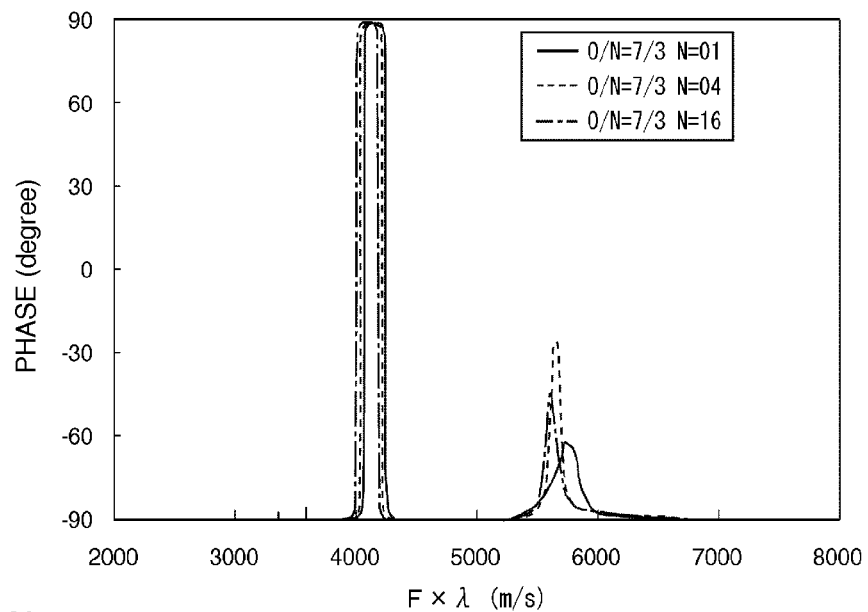
FIG. 29 is a graph showing changes in phase characteristics when the number of layers stacked is changed in structures including a multilayer body including a low-velocity medium layer composed of $SiO_2$ and a high-velocity medium layer composed of SiN.
Figure 30:
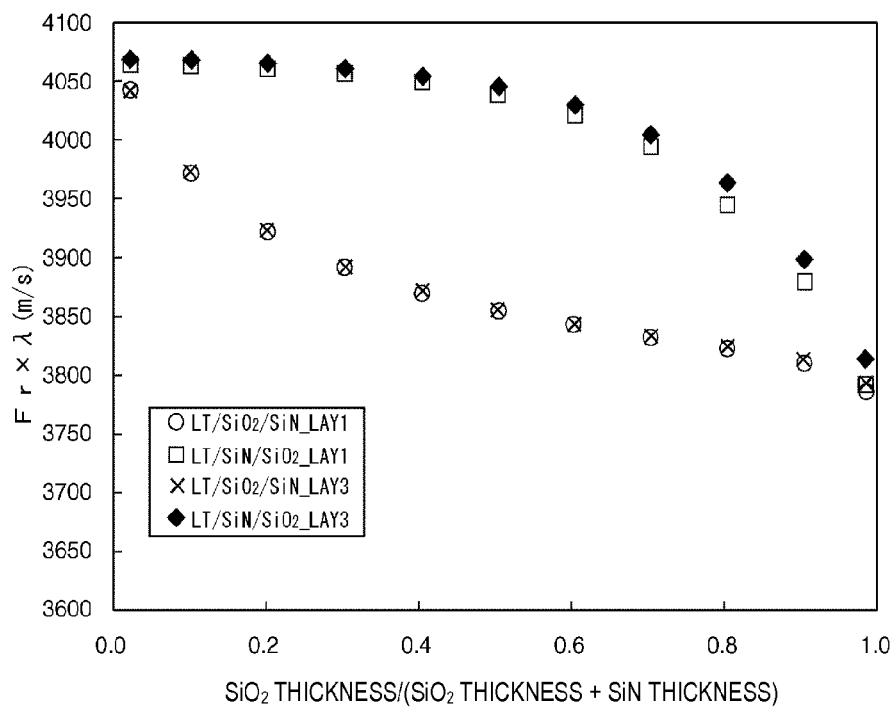
FIG. 30 is a graph showing the relationship between the $SiO_2$ thickness ratio and the acoustic velocity in structures including a multilayer body including a low-velocity medium layer composed of $SiO_2$ and a high-velocity medium layer composed of SiN.
Figure 31:
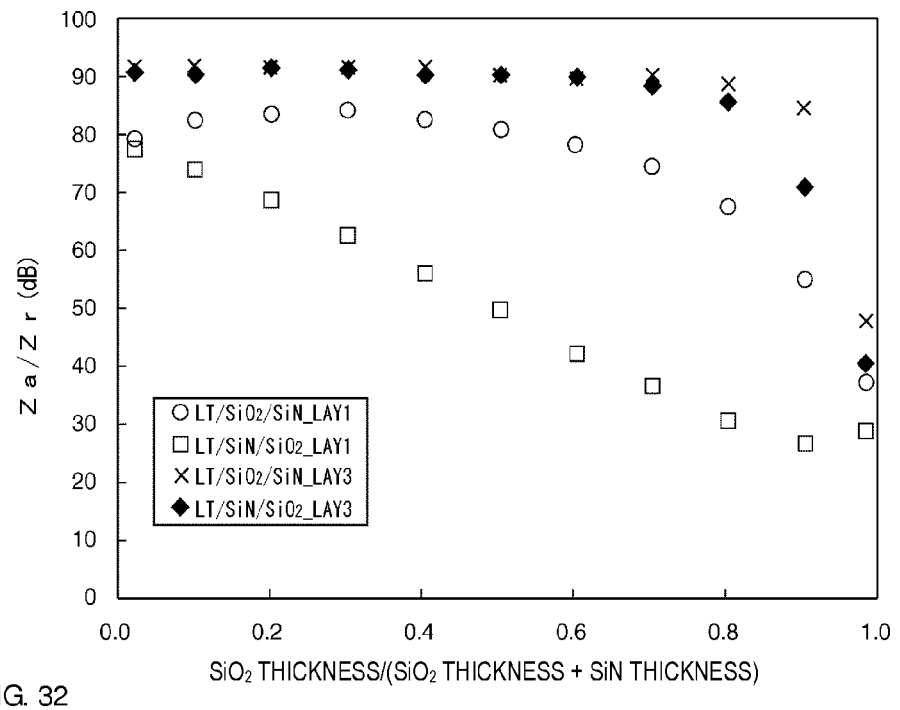
FIG. 31 is a graph showing the relationship between the $SiO_2$ thickness ratio and the top-to-valley ratio (Za/Zr) in structures including a multilayer body including a low-velocity medium layer composed of $SiO_2$ and a high-velocity medium layer composed of SiN.
Figure 32:
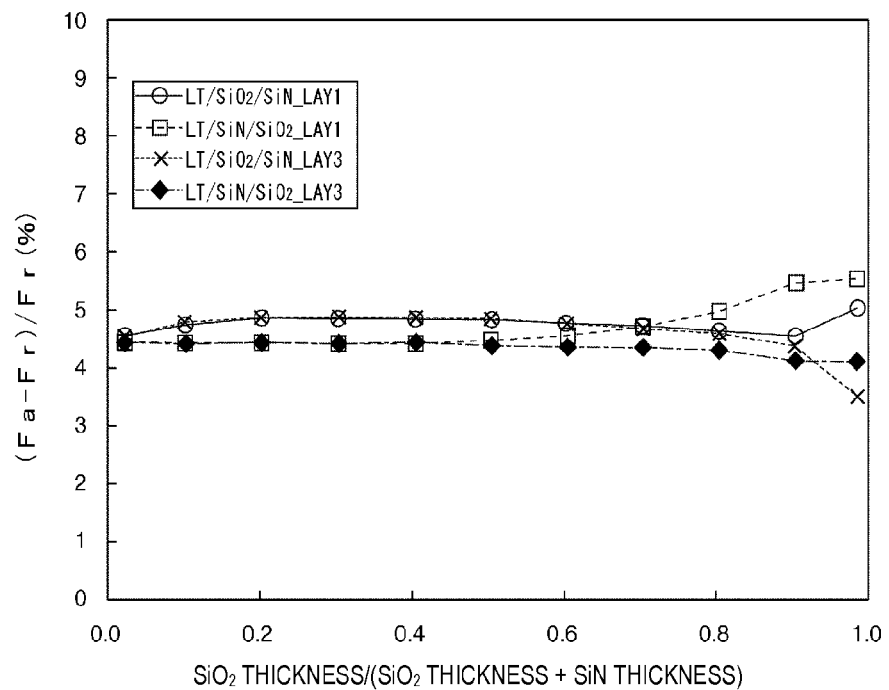
FIG. 32 is a graph showing the relationship between the $SiO_2$ thickness ratio and the band width (Fa−Fr)/(Fr) in structures including a multilayer body including a low-velocity medium layer composed of $SiO_2$ and a high-velocity medium layer composed of SiN.
Figure 33:
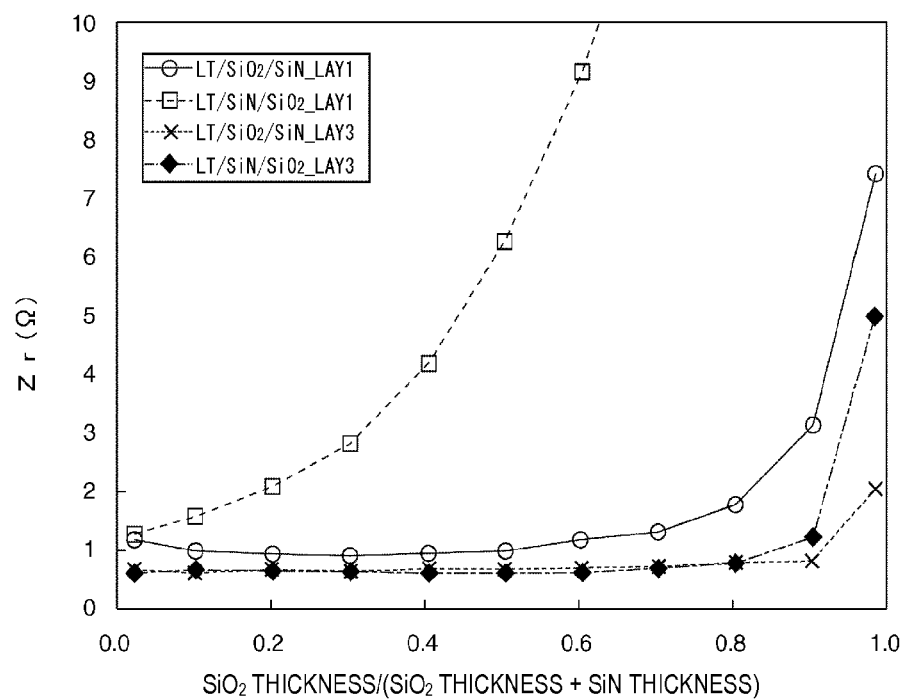
FIG. 33 is a graph showing the relationship between the $SiO_2$ thickness ratio and the minimum impedance Zr in structures including a multilayer body including a low-velocity medium layer composed of $SiO_2$ and a high-velocity medium layer composed of SiN.

FIG. 28 shows impedance characteristics in the case where silicon nitride which is a high-velocity medium layer is disposed on the $LiTaO_3$ side, and FIG. 29 shows phase characteristics.

FIGS. 30 to 33 are graphs showing the relationship between the $SiO_2$ thickness ratio and the acoustic velocity Fr×$\lambda$, the top-to-valley ratio (Za/Zr), the band width (Fa−Fr)/(Fr), or the minimum impedance Zr in structures including a multilayer body including a low-velocity medium layer composed of $SiO_2$ and a high-velocity medium layer composed of SiN. In FIGS. 30 to 33, LAY1 indicates one layer, and LAY3 indicates three layers.

In FIGS. 22 to 25, FIGS. 26 to 29, and FIGS. 30 to 33, the thickness of the multilayer body is constant at 1$\lambda$.

As is evident from FIG. 22, in the case where the thickness of the medium layer preferably defined by the multilayer body is constant, as the number of layers stacked increases, the acoustic velocity increases in the case where silicon oxide is on the $LiTaO_3$ side. On the other hand, as the number of layers stacked increases, the acoustic velocity decreases in the case where silicon nitride which is a high-velocity medium layer is disposed on the $LiTaO_3$ side. In either case, when the number of layers stacked exceeds 100, the acoustic velocity converges to the value according to the thickness ratio. The converged acoustic velocity is the intermediate value between the acoustic velocity of silicon nitride and the acoustic velocity of silicon oxide. Therefore, it is believed that the acoustic velocity of the bulk wave propagating in the multilayer body in which the high-velocity medium layer and the low-velocity medium layer are stacked is the intermediate value according to the thickness ratio of silicon nitride and silicon oxide as in the case of the medium layer 3 composed of the mixed material in the first preferred embodiment.

Furthermore, in the case where silicon nitride which is the high-velocity medium layer is located on the $LiTaO_3$ side, as the number of layers stacked decreases and the total thickness of silicon nitride layers increases, the impedance ratio |Z| and the resonant resistance Zr markedly decrease. For example, as is evident from FIG. 23, when N/O=1/9, in the case where the number of layers stacked is 1, the impedance ratio |Z| is decreased to 30 dB. In contrast, in the case where silicon oxide constituting the low-velocity medium layer is disposed close to $LiTaO_3$, the impedance ratio |Z| is not decreased. The reason for this is believed to be that when the high-velocity medium layer is disposed close to the piezoelectric body, energy of the fundamental mode of the SH-type surface acoustic wave used does not concentrate on the surface of LiTaO$_3$, but leakage of energy occurs.

Therefore, the structure in which the low-velocity medium layer is disposed on the piezoelectric body side is preferable. In such a case, even in a multilayer body in which one high-velocity medium layer and one low-velocity medium layer only are stacked, the propagation loss is suppressed. As a result, the impedance ratio |Z| increases to more than about 70 dB, and the absolute value of the minimum impedance is decreased to less than about 1.2Ω, for example. That is, good resonance characteristics are obtained.

However, the high-velocity medium layer may be located on the LiTaO$_3$ side. In such a case, by stacking at least two high-velocity medium layers and at least two low-velocity medium layers or by setting the N/O ratio to about 3/7 or more, for example, the whole multilayer body achieves a relatively high acoustic velocity. Thus, the impedance ratio |Z| preferably is set to about 50 dB or more.

Furthermore, as is evident from FIGS. 30 to 33, when the number of layers stacked is small, such as one to three, in the case where the low-velocity medium layer is located on the piezoelectric body side, the band width (Fa–Fr)/(Fr) increases, and the electromechanical coupling coefficient k$^2$ is increased. Similarly, when the number of layers stacked is small, such as one to three, the influence of the acoustic velocity of the piezoelectric body is large.

Figure 34A:
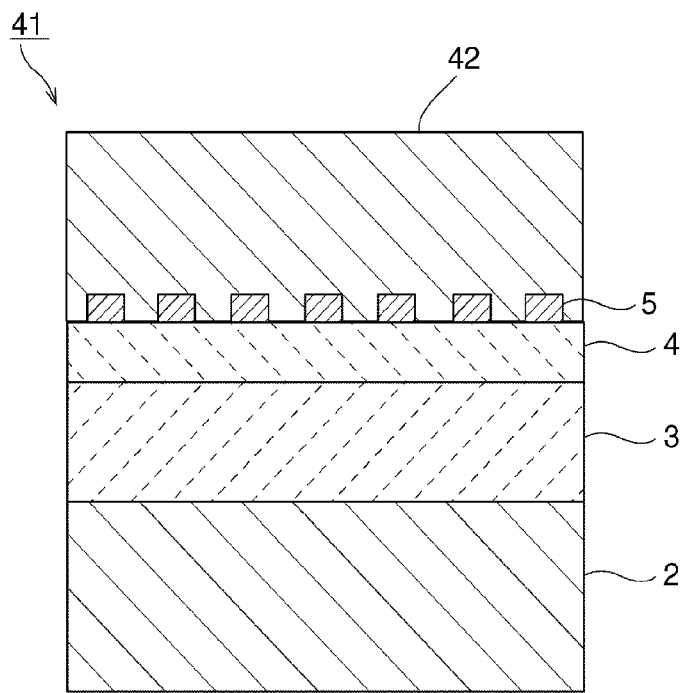
FIGS. 34A and 34B are each a schematic elevational cross-sectional view showing a modification example of an elastic wave device according to a preferred embodiment of the present invention.
Figure 34B:
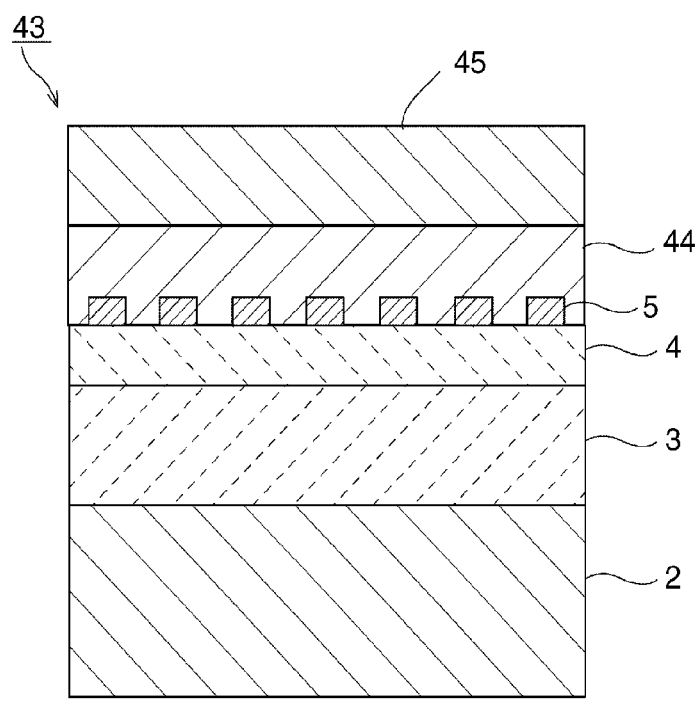

In the first and second preferred embodiments and the modification examples described above, a surface acoustic wave preferably is used. However, in other preferred embodiments of the present invention, a boundary acoustic wave may be used in addition to the surface acoustic wave. FIGS. 34A and 34B each schematically show a boundary acoustic wave device having the medium layer according to a preferred embodiment of the present invention.

In a boundary acoustic wave device 41 shown in FIG. 34A, a medium layer 3, a piezoelectric body 4, and an electrode structure including an IDT electrode 5 are stacked in that order on a supporting substrate 2. The structure is preferably the same or substantially the same as that of the elastic wave device 1 of the first preferred embodiment thus far. In this preferred embodiment, in order to use a boundary acoustic wave, a dielectric layer 42 is disposed so as to cover the IDT electrode 5. The dielectric layer 42 can be formed of an appropriate dielectric material, such as silicon oxide, silicon nitride, or aluminum nitride, for example.

Furthermore, in a boundary acoustic wave device 43 shown in FIG. 34B, a first dielectric layer 44 is disposed so as to cover an IDT electrode 5, and a second dielectric layer 45 is stacked on the first dielectric layer 44. The first dielectric layer 44 preferably is composed of an appropriate dielectric material in which the acoustic velocity of a slow transversal wave propagating therein is lower than that of the dielectric material constituting the second dielectric layer 45. Examples of a combination of such dielectric materials include a combination of a first dielectric layer 44 composed of silicon oxide and a second dielectric layer 45 composed of silicon nitride or aluminum nitride.

Furthermore, in the boundary acoustic wave devices 41 and 43, the supporting substrate 2, the medium layer 3, the piezoelectric body 4, and the IDT electrode 5 preferably may be formed using the same materials as those in the first preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a supporting substrate;
a medium layer stacked on the supporting substrate;
a piezoelectric body which is stacked on the medium layer and in which a bulk wave propagates; and
an IDT electrode disposed on a surface of the piezoelectric body; wherein
the medium layer includes a low-velocity medium in which a propagation velocity of a same bulk wave as that which is a main component of an elastic wave propagating in the piezoelectric body is lower than an acoustic velocity of an elastic wave propagating in the piezoelectric body, and a high-velocity medium in which the propagation velocity of the same bulk wave as that which is the main component of the elastic wave propagating in the piezoelectric body is higher than the acoustic velocity of the elastic wave propagating in the piezoelectric body; and
the medium layer is configured such that an acoustic velocity of a main vibration mode in the elastic wave device including the medium layer satisfies a relationship $V_L$ <acoustic velocity of main vibration mode <$V_H$, where $V_H$ is an acoustic velocity of the main vibration mode in a case in which the medium layer is made of the high-velocity medium, and $V_L$ is an acoustic velocity of the main vibration mode in the case in which the medium layer is made of the low-velocity medium.

2. The elastic wave device according to claim 1, wherein a dielectric constant of the medium layer is lower than a dielectric constant of the piezoelectric body.

3. The elastic wave device according to claim 1, wherein the medium layer is made of a composite medium including a mixture of the low-velocity medium and the high-velocity medium.

4. The elastic wave device according to claim 3, wherein the acoustic velocity of a bulk wave component that propagates in the medium layer and that is the same bulk wave which is a main propagation mode of an elastic wave propagating in the piezoelectric body is a value between an acoustic velocity of the bulk wave propagating in the high-velocity medium and an acoustic velocity of a bulk wave propagating in the low-velocity medium.

5. The elastic wave device according to claim 4, wherein a dielectric constant of the medium layer is lower than a dielectric constant of the piezoelectric body.

6. The elastic wave device according to claim 3, wherein a dielectric constant of the medium layer is lower than a dielectric constant of the piezoelectric body.

7. The elastic wave device according to claim 1, wherein the medium layer is defined by a multilayer body including a low-velocity medium layer made of the low-velocity medium and a high-velocity medium layer made of the high-velocity medium.

8. The elastic wave device according to claim 7, wherein the multilayer body includes at least three layers stacked on each other.

9. The elastic wave device according to claim 8, wherein a dielectric constant of the medium layer is lower than a dielectric constant of the piezoelectric body.

10. The elastic wave device according to claim 7, wherein a dielectric constant of the medium layer is lower than a dielectric constant of the piezoelectric body.

11. The elastic wave device according to claim 7, wherein, in the medium layer defined by the multilayer body, the low-velocity medium layer is disposed closer to the piezoelectric body than the high-velocity medium layer.

12. The elastic wave device according to claim 1, wherein the acoustic velocity of a bulk wave component that propagates in the medium layer and that is the same bulk wave which is a main propagation mode of an elastic wave propagating in the piezoelectric body is a value between an acoustic velocity of the bulk wave propagating in the high-velocity medium and an acoustic velocity of a bulk wave propagating in the low-velocity medium.

13. The elastic wave device according to claim 12, wherein a dielectric constant of the medium layer is lower than a dielectric constant of the piezoelectric body.

* * * * *